(12) United States Patent
Gruening-von Schwerin et al.

(10) Patent No.: US 7,324,365 B2
(45) Date of Patent: Jan. 29, 2008

(54) PHASE CHANGE MEMORY FABRICATED USING SELF-ALIGNED PROCESSING

(75) Inventors: Ulrike Gruening-von Schwerin, München (DE); Thomas Happ, Tarrytown, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/366,370

(22) Filed: Mar. 2, 2006

(65) Prior Publication Data

US 2007/0230237 A1 Oct. 4, 2007

(51) Int. Cl.
*G11C 11/00* (2006.01)
(52) U.S. Cl. ........................... 365/148; 365/163
(58) Field of Classification Search ................ 365/163, 365/148, 113
See application file for complete search history.

(56) References Cited

U.S. PATENT DOCUMENTS

| | | | |
|---|---|---|---|
| 6,531,373 B2 * | 3/2003 | Gill et al. | 438/400 |
| 6,545,903 B1 * | 4/2003 | Wu | 365/148 |
| 6,579,760 B1 | 6/2003 | Lung | 438/257 |
| 6,750,101 B2 | 6/2004 | Lung | 438/257 |
| 6,816,404 B2 * | 11/2004 | Khouri et al. | 365/163 |
| 6,894,305 B2 * | 5/2005 | Yi et al. | 257/4 |
| 7,208,751 B2 * | 4/2007 | Ooishi | 257/5 |
| 2005/0036364 A1 * | 2/2005 | Ha et al. | 365/163 |
| 2005/0242338 A1 | 11/2005 | Hart et al. | 257/3 |

FOREIGN PATENT DOCUMENTS

DE 10 2004 014 487 A1 11/2005

OTHER PUBLICATIONS

S.J. Ahn et al., "Highly Manufacturable High Density Phase Change Memory of 64 Mb and Beyond", IEDM 2004.
H. Horrii et al., "A Novel Cell Technology Using N-doped GeSbTe Films for Phase Change RAM", VLSI, 2003.
Y.N. Hwang et al., "Full Integration and Reliability Evaluation of Phase-change RAM Based on 0.24µm-CMOS Technologies", VLSI, 2003.
Stefan Lai et al., "OUM—A 180 nm Nonvolatile Memory Cell Element Technology For Stand Alone and Embedded Applications", IEDM, 2001.
Y.H. Ha et al., "An Edge Contact Type Cell for Phase Change RAM Featuring Very Low Power Consumption", VLSI, 2003.
F. Pellizzer et al., "Novel µTrench Phase-Change Memory Cell for Embedded and Stand-Alone Non-Volatile Memory Applications", VLSI, 2004.

* cited by examiner

*Primary Examiner*—Tan T. Nguyen
(74) *Attorney, Agent, or Firm*—Dicke, Billig & Czaja, PLLC

(57) ABSTRACT

A memory includes transistors in rows and columns providing an array, conductive lines in columns across the array, and phase change elements contacting the conductive lines and self-aligned to the conductive lines. The memory includes bottom electrodes contacting the phase change elements, each bottom electrode self-aligned to a conductive line and coupled to one side of a source-drain path of a transistor.

19 Claims, 24 Drawing Sheets

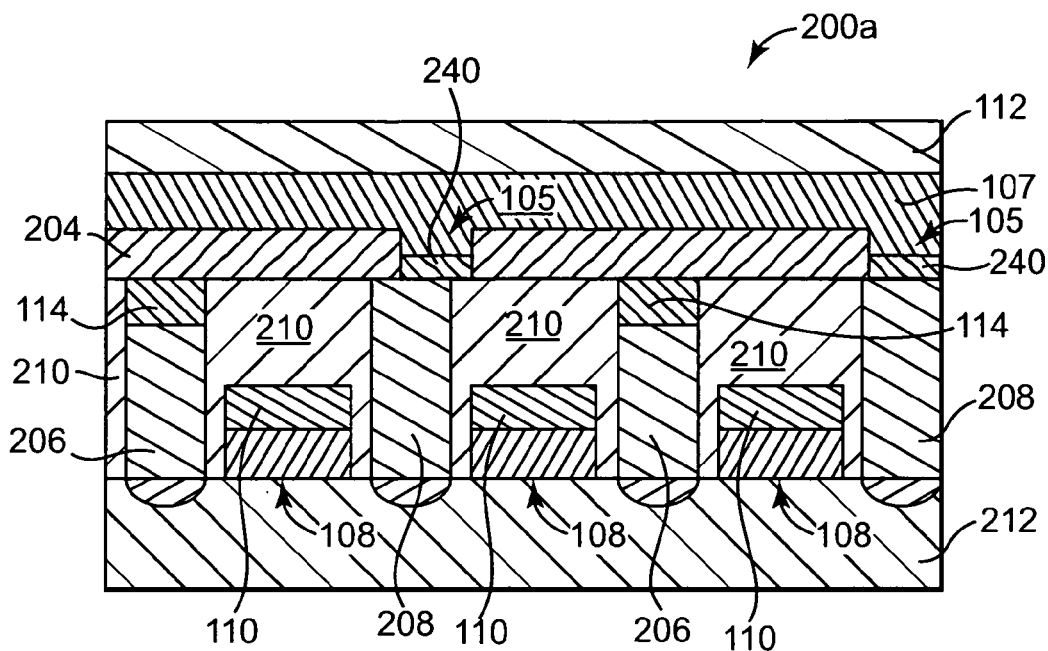
Fig. 2A
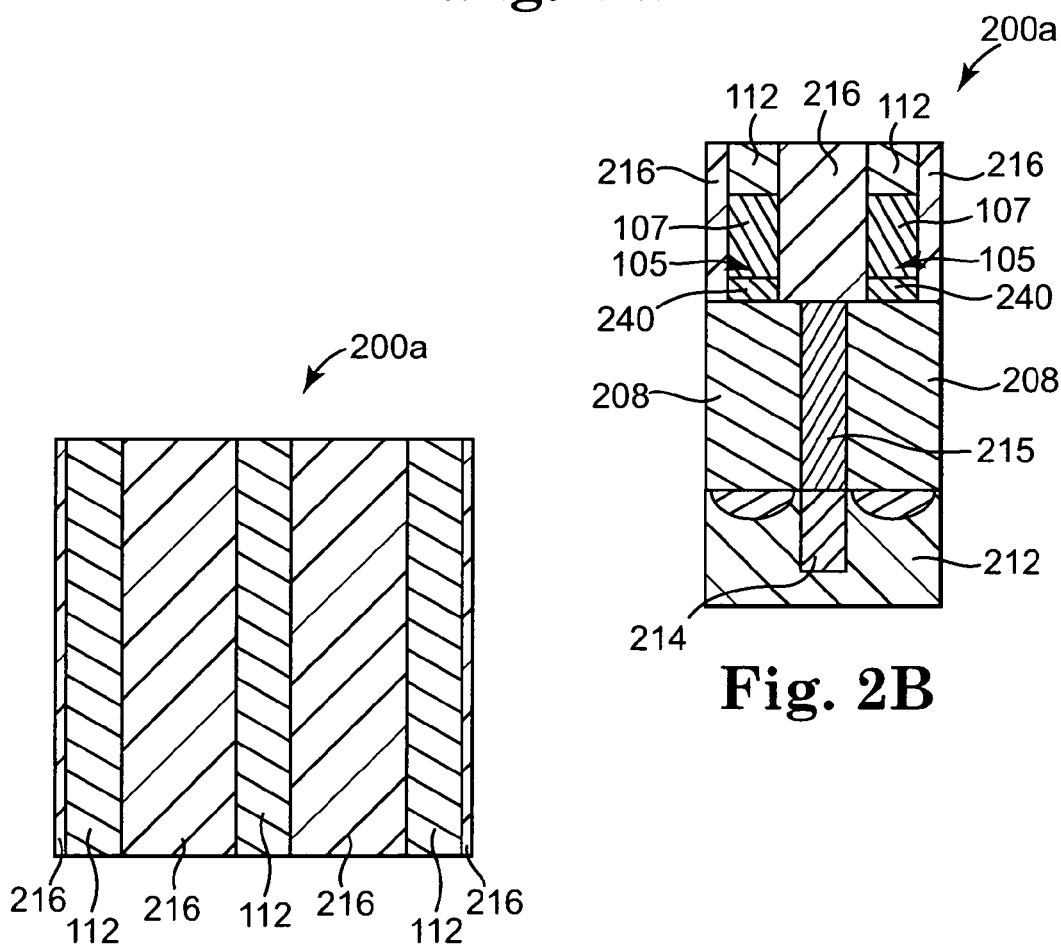
Fig. 2B
Fig. 2C

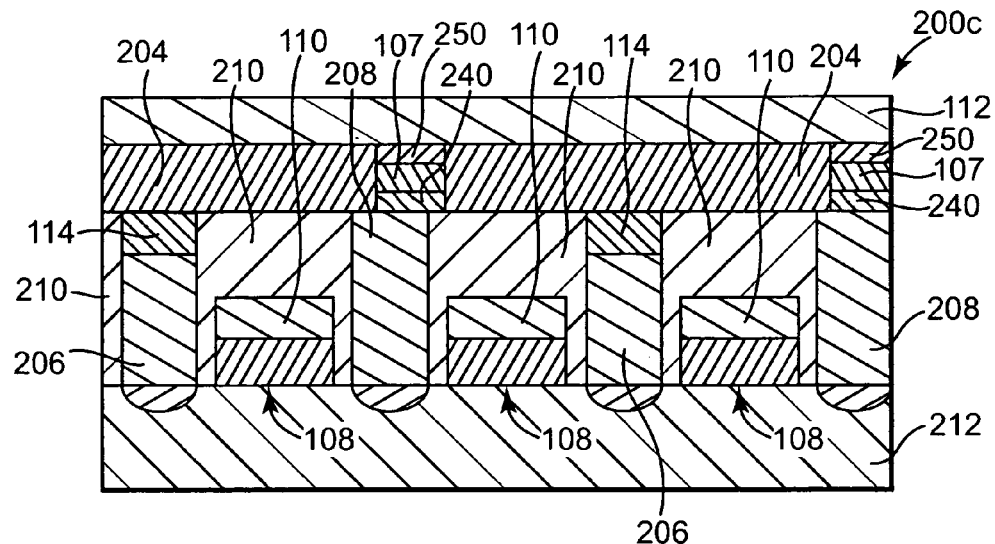
Fig. 23A
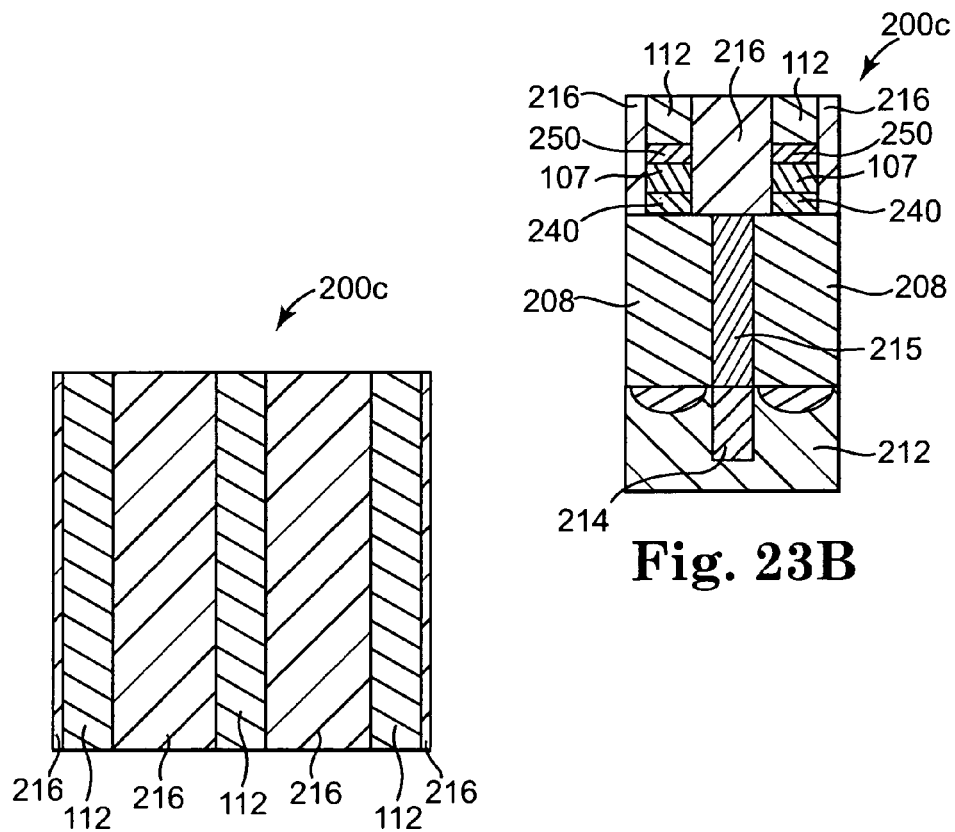
Fig. 23B
Fig. 23C

PHASE CHANGE MEMORY FABRICATED USING SELF-ALIGNED PROCESSING

CROSS-REFERENCE TO RELATED APPLICATIONS

This application is related to U.S. patent application Ser. No. 11/366,151, entitled "PHASE CHANGE MEMORY FABRICATED USING SELF-ALIGNED PROCESSING" and U.S. patent application Ser. No. 11/366,706, entitled "PHASE CHANGE MEMORY FABRICATED USING SELF-ALIGNED PROCESSING," both filed concurrently on the same day with the present application and both incorporated herein by reference.

BACKGROUND

One type of non-volatile memory is resistive memory. Resistive memory utilizes the resistance value of a memory element to store one or more bits of data. For example, a memory element programmed to have a high resistance value may represent a logic "1" data bit value, and a memory element programmed to have a low resistance value may represent a logic "0" data bit value. The resistance value of the memory element is switched electrically by applying a voltage pulse or a current pulse to the memory element. One type of resistive memory is phase change memory. Phase change memory uses a phase change material for the resistive memory element.

Phase change memories are based on phase change materials that exhibit at least two different states. Phase change material may be used in memory cells to store bits of data. The states of phase change material may be referred to as amorphous and crystalline states. The states may be distinguished because the amorphous state generally exhibits higher resistivity than does the crystalline state. Generally, the amorphous state involves a more disordered atomic structure, while the crystalline state involves a more ordered lattice. Some phase change materials exhibit more than one crystalline state, e.g. a face-centered cubic (FCC) state and a hexagonal closest packing (HCP) state. These two crystalline states have different resistivities and may be used to store bits of data.

Phase change in the phase change materials may be induced reversibly. In this way, the memory may change from the amorphous state to the crystalline state and from the crystalline state to the amorphous state in response to temperature changes. The temperature changes to the phase change material may be achieved in a variety of ways. For example, a laser can be directed to the phase change material, current may be driven through the phase change material, or current can be fed through a resistive heater adjacent the phase change material. In any of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The level of current and/or voltage generally corresponds to the temperature induced within the phase change material in each memory cell.

For data storage applications, reducing the physical memory cell size is a continuing goal. Reducing the physical memory cell size increases the storage density of the memory and reduces the cost of the memory. To reduce the physical memory cell size, the memory cell layout should be lithography friendly. In addition, since interface resistances between metal and active material within memory cells contributes considerably to the overall resistance for small areas, the interface areas should be well controlled. Finally, the memory cell layout should have mechanical stability to improve the chemical mechanical planarization (CMP) process window to enable greater yields.

For these and other reasons, there is a need for the present invention.

SUMMARY

One embodiment of the present invention provides a memory. The memory includes transistors in rows and columns providing an array, conductive lines in columns across the array, and phase change elements contacting the conductive lines and self-aligned to the conductive lines. The memory includes bottom electrodes contacting the phase change elements, each bottom electrode self-aligned to a conductive line and coupled to one side of a source-drain path of a transistor.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 2A illustrates a cross-sectional view of one embodiment of an array of phase change memory cells.

FIG. 2B illustrates a perpendicular cross-sectional view of the array of phase change memory cells illustrated in FIG. 2A.

FIG. 2C illustrates a top view of the array of phase change memory cells illustrated in FIG. 2A.

FIG. 23A illustrates a cross-sectional view of another embodiment of an array of phase change memory cells.

FIG. 23B illustrates a perpendicular cross-sectional view of the array of phase change memory cells illustrated in FIG. 23A.

FIG. 23C illustrates a top view of the array of phase change memory cells illustrated in FIG. 23A.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
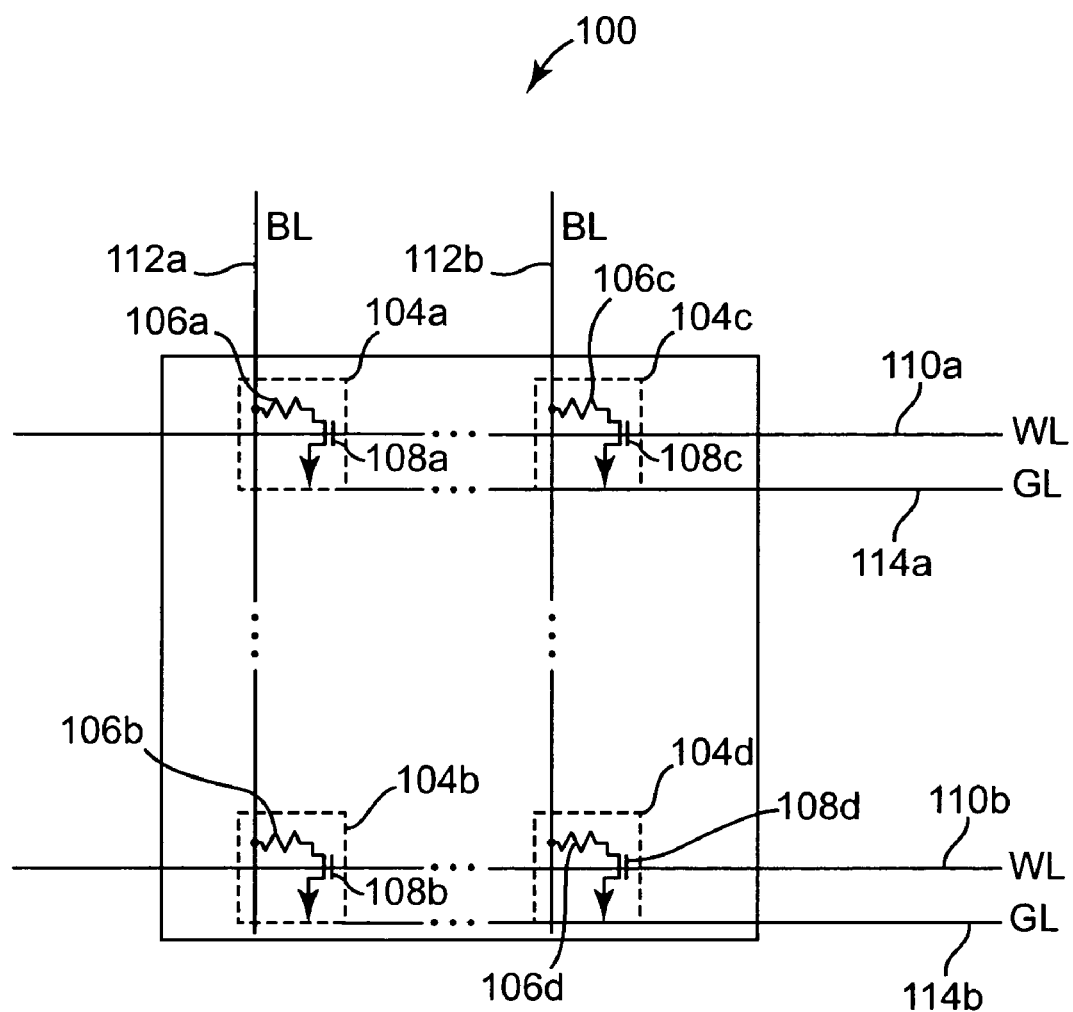
FIG. 1 is a diagram illustrating one embodiment of an array of phase change memory cells.

FIG. 1 is a diagram illustrating one embodiment of an array of phase-change memory cells 100. Memory array 100 is fabricated using line lithography and self-aligned processing to minimize critical lithography steps. In addition, the interface resistance between metal and active material is overlay-insensitive and by maximizing the interface areas, parasitic resistances are minimized. Memory array 100 does not have any isolated, small patterns such that the chemical mechanical planarization (CMP) process window is improved and mechanical stability is improved.

Memory array 100 includes a plurality of phase-change memory cells 104a-104d (collectively referred to as phase-change memory cells 104), a plurality of bit lines (BLs) 112a-112b (collectively referred to as bit lines 112), a plurality of word lines (WLs) 110a-110b (collectively referred to as word lines 110), and a plurality of ground lines (GLs) 114a-114b (collectively referred to as ground lines 114).

As used herein, the term "electrically coupled" is not meant to mean that the elements must be directly coupled together and intervening elements may be provided between the "electrically coupled" elements.

Each phase-change memory cell 104 is electrically coupled to a word line 110, a bit line 112, and a ground line 114. For example, phase-change memory cell 104a is electrically coupled to bit line 112a, word line 110a, and ground line 114a, and phase-change memory cell 104b is electrically coupled to bit line 112a, word line 110b, and ground line 114b. Phase-change memory cell 104c is electrically coupled to bit line 112b, word line 110a, and ground line 114a, and phase-change memory cell 104d is electrically coupled to bit line 112b, word line 110b, and ground line 114b.

Each phase-change memory cell 104 includes a phase-change element 106 and a transistor 108. While transistor 108 is a field-effect transistor (FET) in the illustrated embodiment, in other embodiments, transistor 108 can be another suitable device such as a bipolar transistor or a 3D transistor structure. Phase-change memory cell 104a includes phase-change element 106a and transistor 108a. One side of phase-change element 106a is electrically coupled to bit line 112a, and the other side of phase-change element 106a is electrically coupled to one side of the source-drain path of transistor 108a. The other side of the source-drain path of transistor 108a is electrically coupled to ground line 114a. The gate of transistor 108a is electrically coupled to word line 110a. Phase-change memory cell 104b includes phase-change element 106b and transistor 108b. One side of phase-change element 106b is electrically coupled to bit line 112a, and the other side of phase-change element 106b is electrically coupled to one side of the source-drain path of transistor 108b. The other side of the source-drain path of transistor 108b is electrically coupled to ground line 114b. The gate of transistor 108b is electrically coupled to word line 110b.

Phase-change memory cell 104c includes phase-change element 106c and transistor 108c. One side of phase-change element 106c is electrically coupled to bit line 112b and the other side of phase-change element 106c is electrically coupled to one side of the source-drain path of transistor 108c. The other side of the source-drain path of transistor 108c is electrically coupled to ground line 114a. The gate of transistor 108c is electrically coupled to word line 110a. Phase-change memory cell 104d includes phase-change element 106d and transistor 108d. One side of phase-change element 106d is electrically coupled to bit line 112b and the other side of phase-change element 106d is electrically coupled to one side of the source-drain path of transistor 108d. The other side of the source-drain path of transistor 108d is electrically coupled to ground line 114b. The gate of transistor 108d is electrically coupled to word line 110b.

In another embodiment, each phase-change element 106 is electrically coupled to a ground line 114 and each transistor 108 is electrically coupled to a bit line 112. For example, for phase-change memory cell 104a, one side of phase-change element 106a is electrically coupled to ground line 114a. The other side of phase-change element 106a is electrically coupled to one side of the source-drain path of transistor 108a. The other side of the source-drain path of transistor 108a is electrically coupled to bit line 112a. In general, the ground lines 114 have a lower potential than the bit lines 112.

Each phase-change element 106 comprises a phase-change material that may be made up of a variety of materials in accordance with the present invention. Generally, chalcogenide alloys that contain one or more elements from group VI of the periodic table are useful as such materials. In one embodiment, the phase-change material of phase-change element 106 is made up of a chalcogenide compound material, such as GeSbTe, SbTe, GeTe or AgInSbTe. In another embodiment, the phase-change material is chalcogen free, such as GeSb, GaSb, InSb, or GeGaInSb. In other embodiments, the phase-change material is made up of any suitable material including one or more of the elements Ge, Sb, Te, Ga, As, In, Se, and S.

During a set operation of phase-change memory cell 104a, a set current or voltage pulse is selectively enabled and sent through bit line 112a to phase-change element 106a thereby heating it above it's crystallization temperature (but usually below it's melting temperature) with word line 110a selected to activate transistor 108a. In this way, phase-change element 106a reaches its crystalline state during this set operation. During a reset operation of phase-change memory cell 104a, a reset current or voltage pulse is selectively enabled to bit line 112a and sent to phase-change material element 106a. The reset current or voltage quickly heats phase-change element 106a above its melting temperature. After the current or voltage pulse is turned off, the phase-change element 106a quickly quench cools into the amorphous state. Phase-change memory cells 104b-104d and other phase-change memory cells 104 in memory array 100 are set and reset similarly to phase-change memory cell 104a using a similar current or voltage pulse.

FIG. 2A illustrates a cross-sectional view of one embodiment of an array of phase change memory cells 200a. FIG. 2B illustrates a perpendicular cross-sectional view of array of phase change memory cells 200a illustrated in FIG. 2A. FIG. 2C illustrates a top view of array of phase change memory cells 200a illustrated in FIG. 2A. In one embodiment, array of phase change memory cells 100 is similar to array of phase change memory cells 200a. Array of phase change memory cells 200a includes substrate 212, transistors 108, word lines 110, first contacts 206, second contacts 208, ground lines 114, bottom electrodes 240, dielectric material 204, 210, and 216, shallow trench isolation (STI) 214, inter level dielectric (ILD) 215, phase change material 107, and bits lines 112. Metal wiring (not shown) follows after the bit line level.

Transistors 108 for selecting storage locations 105 in phase change material 107 are formed in substrate 212 in rows and columns. The gates of transistors 108 are electrically coupled to word lines 110. Dielectric material 210 is deposited over transistors 108 and word lines 110. First contacts 206 electrically couple one side of the source-drain path of each transistor 108 to a ground line 114. Second contacts 208 electrically couple the other side of the source-drain path of each transistor 108 to a bottom electrode 240. Each bottom electrode 240 is electrically coupled to a storage location 105, which is a part of phase change material 107. Each line of phase change material 107 is electrically coupled to a bit line 112. Bit lines 112 are perpendicular to word lines 110 and ground lines 114. Dielectric material 204 insulates ground lines 114 above first contacts 206. Dielectric material 216 insulates bits lines 112, lines of phase change material 107, and bottom electrodes 240 from adjacent bit lines 112, lines of phase change material 107, and bottom electrodes 240. STI 214 insulates transistors 108 from adjacent transistors 108, and ILD 215 insulates second contacts 208 from adjacent second contacts 208.

Lines of phase change material 107, which include storage locations 105, and bottom electrodes 240 are self-aligned to bit lines 112. The self-alignment minimizes critical lithography steps in the fabrication of array of phase change memory cells 200a. In addition, with self-alignment the interface resistances between bottom electrodes 240 and phase change material 107 and between phase change material 107 and bit lines 112 is overlay insensitive and parasitic resistances are minimized.

In one embodiment, array of phase change memory cells 200a is scalable to $8F^2$ for dual gate memory cells, where "F" is the minimum feature size, or to $6F^2$ for single gate memory cells. In the embodiment for single gate memory cells, an active gate of a transistor 108 between every two adjacent memory cells is replaced with an isolation gate (i.e., the transistor is not used as a switch; rather it is always turned off). A first embodiment of a method for fabricating array of phase change memory cells 200a is described and illustrated with reference to the following FIGS. 3A-8C. A second embodiment of a method for fabricating array of phase change memory cells 200a is described and illustrated with reference to the following FIGS. 9A-15C.

Figure 3A:
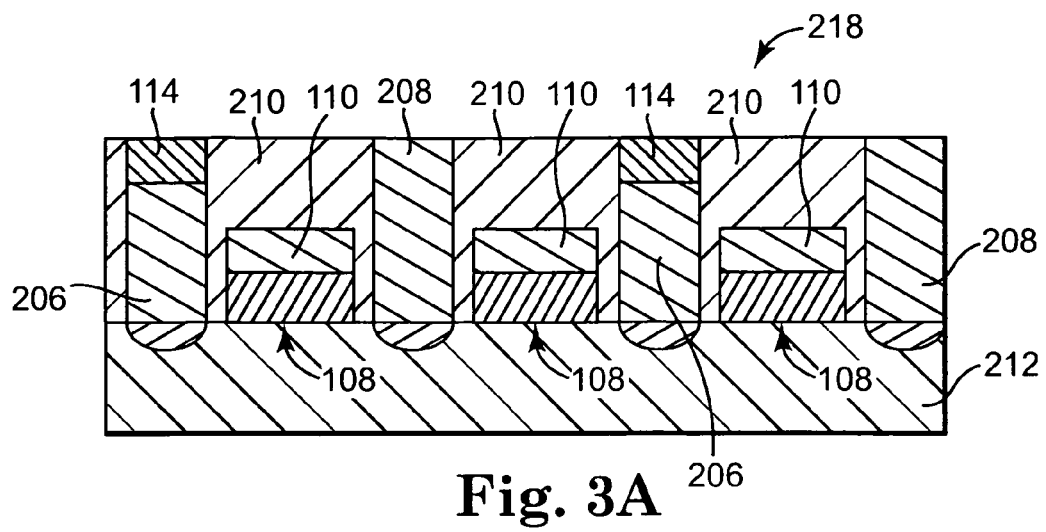
FIG. 3A illustrates a cross-sectional view of one embodiment of a preprocessed wafer.
Figure 3B:
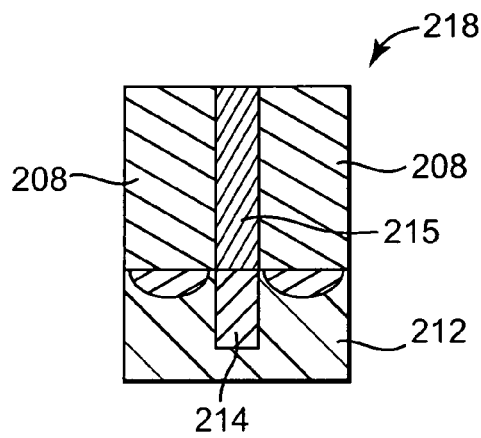
FIG. 3B illustrates a perpendicular cross-sectional view of the preprocessed wafer illustrated in FIG. 3A.
Figures 3C, 3D:
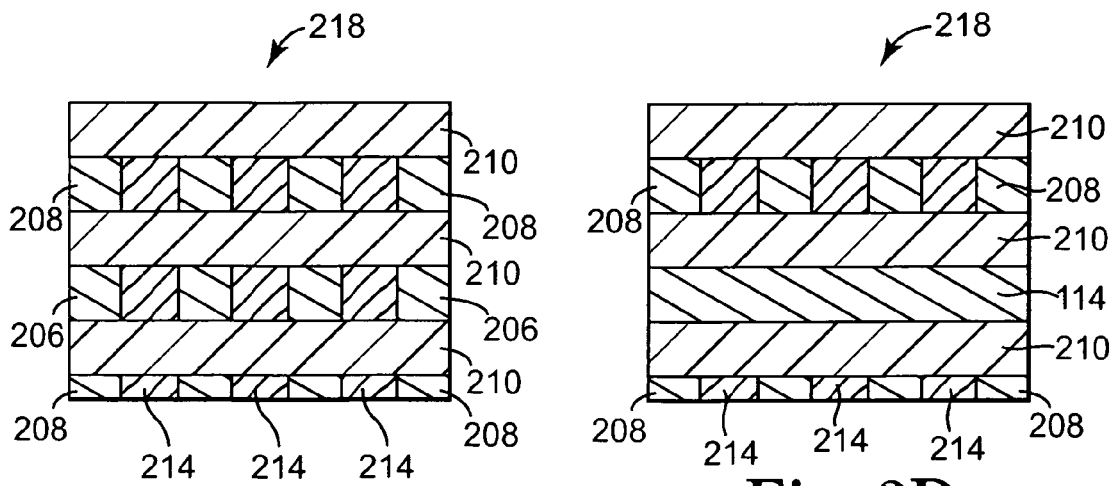
FIG. 3C illustrates a top cross-sectional view of the preprocessed wafer illustrated in FIG. 3A.
FIG. 3D illustrates a top view of the preprocessed wafer illustrated in FIG. 3A.

FIG. 3A illustrates a cross-sectional view of one embodiment of a preprocessed wafer 218. FIG. 3B illustrates a perpendicular cross-sectional view of preprocessed wafer 218 illustrated in FIG. 3A. FIG. 3C illustrates a top cross-sectional view of preprocessed wafer 218 illustrated in FIG. 3A. FIG. 3D illustrates a top view of preprocessed wafer 218 illustrated in FIG. 3A. Preprocessed wafer 218 includes substrate 212, transistors 108, word lines 110, first contacts 206, second contacts 208, ground lines 114, STI 214, ILD 215, and dielectric material 210.

Transistors 108 are formed in substrate 212 in rows and columns. The gates of transistors 108 are electrically coupled to word lines 110. Dielectric material 210 is deposited over transistors 108 and word lines 110. First contacts 206 electrically couple one side of the source-drain path of each transistor 108 to a ground line 114. Second contacts 208 are electrically coupled to the other side of the source-drain path of each transistor 108. STI 214 insulates transistors 108 from adjacent transistors 108, and ILD 215 insulates second contacts 208 from adjacent second contacts 208.

First contacts 206 and second contacts 208 are contact plugs, such as W plugs, Cu plugs, or other suitable conducting material plugs. Word lines 110 comprise doped poly-Si, W, TiN, NiSi, CoSi, TiSi, $WSi_x$, or another suitable material. Ground lines 114 comprise W, Al, Cu, or other suitable material. Dielectric material 210 comprises SiN or other suitable material that enables a borderless contact formation process for first contacts 206 and second contacts 208. STI 214 and ILD 215 comprise $SiO_2$, fluorinated silica glass (FSG), boro-phosphorous silicate glass (BPSG), boro-silicate glass (BSG), or other suitable dielectric material. Word lines 110 are parallel to ground lines 114. Word lines 110 and ground lines 114 are perpendicular to STI 214 and ILD 215.

Figure 4:
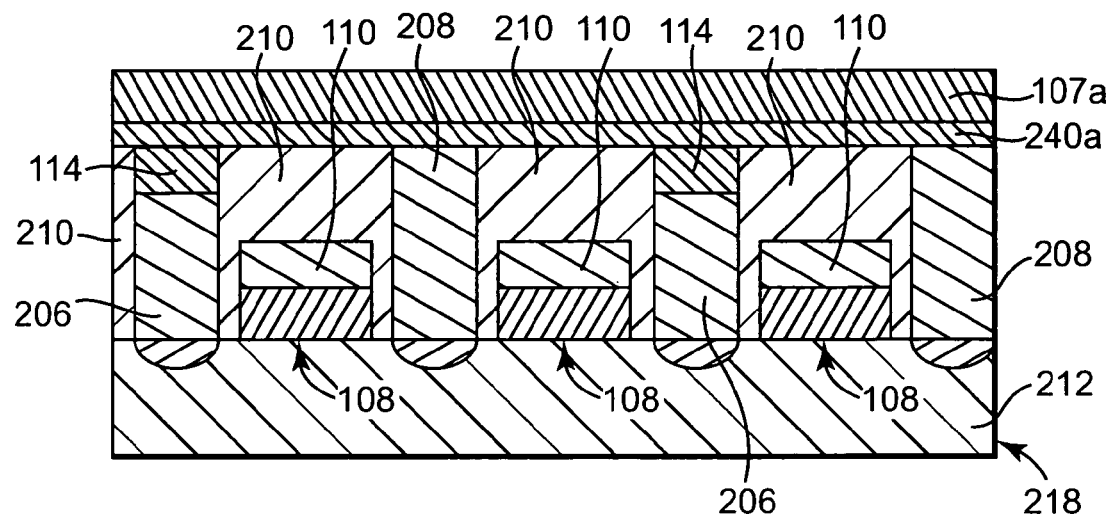
FIG. 4 illustrates a cross-sectional view of one embodiment of the preprocessed wafer, a first electrode material layer, and a first phase change material layer.

FIG. 4 illustrates a cross-sectional view of one embodiment of preprocessed wafer 218, a first electrode material layer 240a, and a first phase change material layer 107a. Electrode material, such as TiN, TaN, W, Al, Cu, TiSiN, TaSiN, or other suitable electrode material, is deposited over preprocessed wafer 218 to provide first electrode material layer 240a. First electrode material layer 240a is deposited using chemical vapor deposition (CVD), atomic layer deposition (ALD), metal organic chemical vapor deposition (MOCVD), plasma vapor deposition (PVD), jet vapor deposition (JVP), or other suitable deposition technique.

Phase change material, such as a chalcogenide compound material or other suitable phase change material, is deposited over first electrode material layer 240a to provide first phase change material layer 107a. First phase change material layer 107a is deposited using CVD, ALD, MOCVD, PVD, JVP, or other suitable deposition technique. In one embodiment, an optional hardmask material layer is deposited over first phase change material layer 107a.

Figure 5:
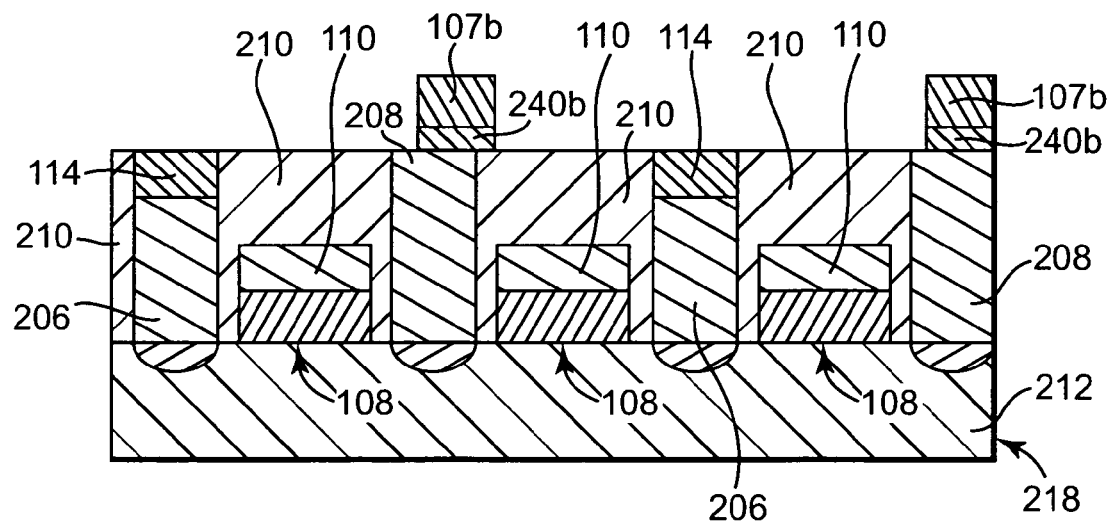
FIG. 5 illustrates a cross-sectional view of one embodiment of the preprocessed wafer, first electrode material layer, and first phase change material layer after etching.

FIG. 5 illustrates a cross-sectional view of one embodiment of preprocessed wafer 218, first electrode material layer 240b, and first phase change material layer 107b after etching first phase change material layer 107a and first electrode material layer 240a. First phase change material layer 107a and first electrode material layer 240a are etched to provide first phase change material layer 107b and first electrode material layer 240b, which is self-aligned to first phase change material layer 107b. Line lithography is used to pattern lines of first phase change material 107b and first electrode material 240b contacting second contacts 208. The line lithography does not need to be precisely centered over second contacts 208 as long as a portion of first electrode material 240b contacts second contacts 208. In this way, the line lithography is less critical yet the desired memory cell size is obtained.

In the embodiment where a hardmask material layer is deposited over first phase change material layer 107a, the hardmask material layer, first phase change material layer 107a, and first electrode material layer 240a are etched to provide an etched hardmask material layer, first phase change material layer 107b, which is self-aligned to the etched hardmask material layer, and first electrode material layer 240b, which is self-aligned to first phase change material layer 107b.

Figure 6A:
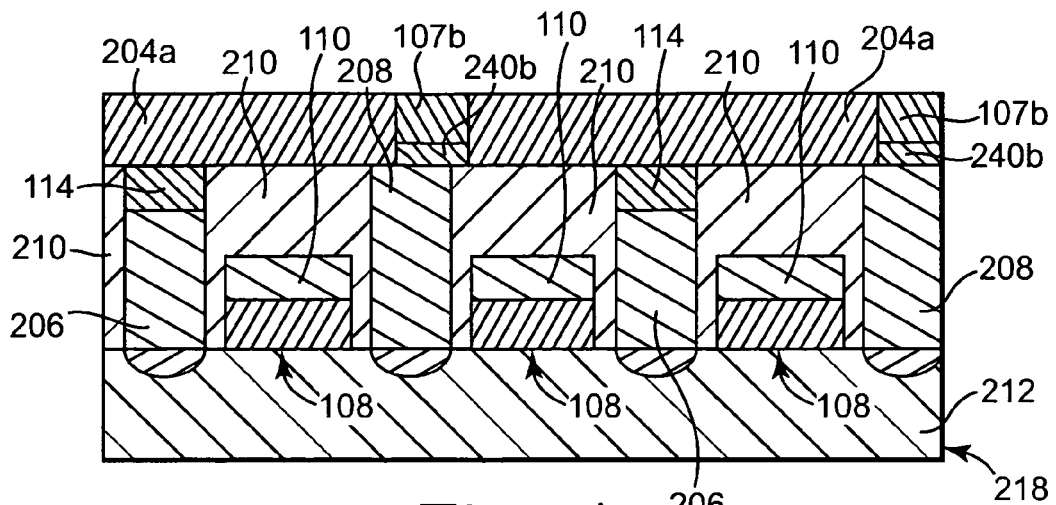
FIG. 6A illustrates a cross-sectional view of one embodiment of the preprocessed wafer, first electrode material layer, first phase change material layer, and a dielectric material layer.
Figure 6B:
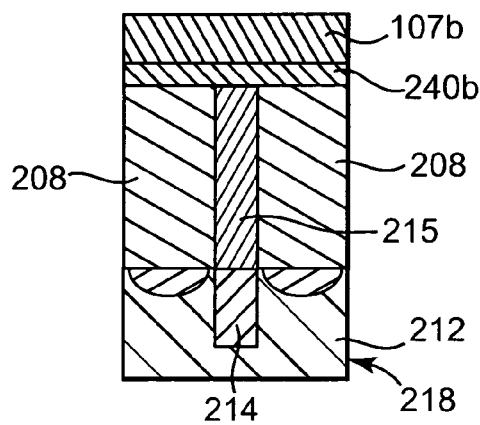
FIG. 6B illustrates a perpendicular cross-sectional view of the wafer illustrated in FIG. 6A.
Figure 6C:
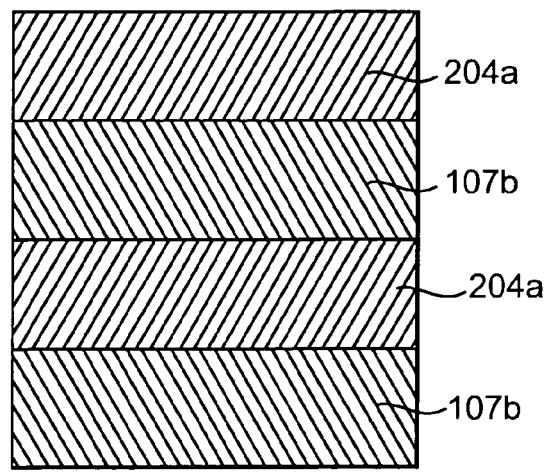
FIG. 6C illustrates a top view of the wafer illustrated in FIG. 6A.

FIG. 6A illustrates a cross-sectional view of one embodiment of preprocessed wafer 218, first electrode material layer 240b, first phase change material layer 107b, and a dielectric material layer 204a. FIG. 6B illustrates a perpendicular cross-sectional view of the wafer illustrated in FIG. 6A, and FIG. 6C illustrates a top view of the wafer illustrated in FIG. 6A. Dielectric material, such as $SiO_2$, FSG, BPSG, BSG, or other suitable dielectric material, is deposited over exposed portions of first phase change material layer 107b, first electrode material layer 240b, and preprocessed wafer 218. The dielectric material layer is deposited using CVD, ALD, MOCVD, PVD, JVP, high-density plasma (HDP), or other suitable deposition technique. The dielectric material layer is planarized to expose first phase change material layer 107b and provide dielectric material layer 204a. The dielectric material layer is planarized using CMP or another suitable planarization technique. In the embodiment where an etched hardmask material layer is over first phase change material layer 107b, the dielectric material layer is planarized to expose the hardmask material. The hardmask material is then removed using a wet etch or other suitable technique.

Figure 7A:
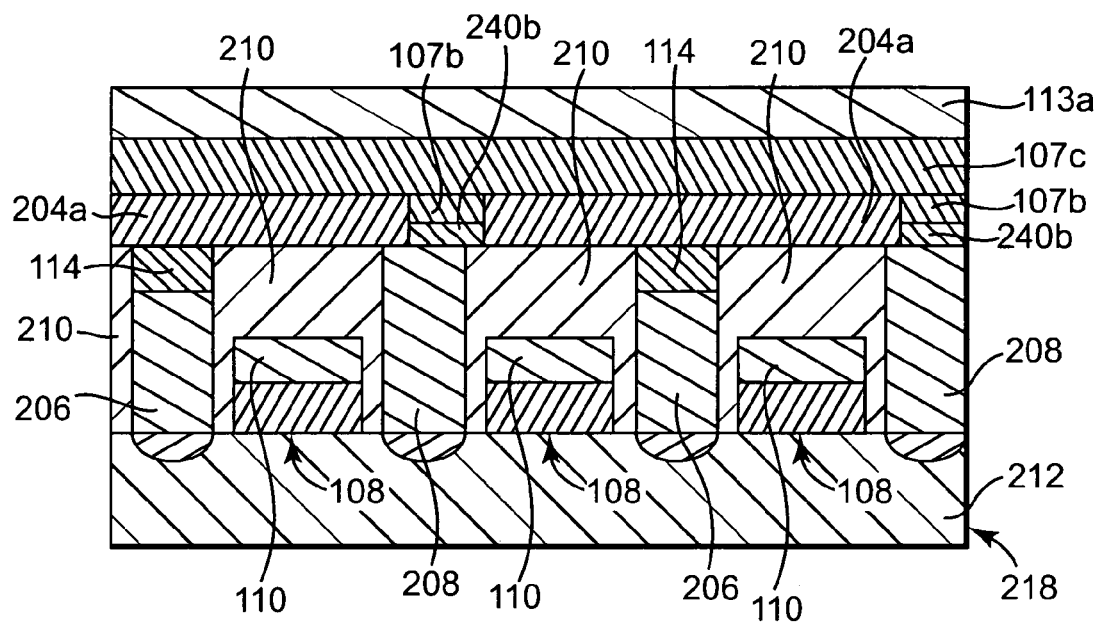
FIG. 7A illustrates a cross-sectional view of one embodiment of the preprocessed wafer, first electrode material layer, first phase change material layer, dielectric material layer, a second phase change material layer, and a second electrode material layer.
Figure 7B:
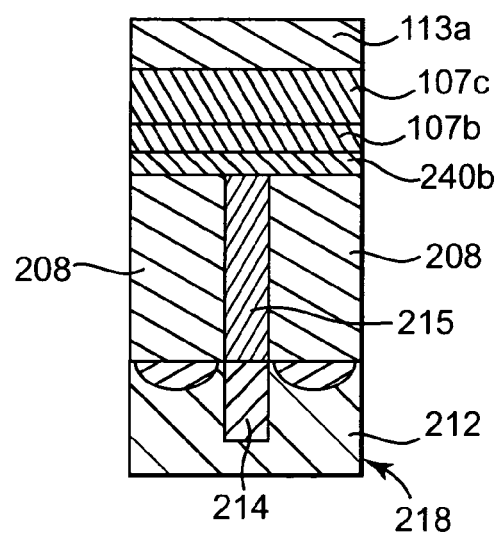
FIG. 7B illustrates a perpendicular cross-sectional view of the wafer illustrated in FIG. 7A.

FIG. 7A illustrates a cross-sectional view of one embodiment of preprocessed wafer 218, first electrode material layer 240b, first phase change material layer 107b, dielectric material layer 204a, a second phase change material layer 107c, and a second electrode material layer 113a. FIG. 7B illustrates a perpendicular cross-sectional view of the wafer illustrated in FIG. 7A. Phase change material, such as a chalcogenide compound material or other suitable phase change material, is deposited over first phase change material layer 107b and dielectric material layer 204a to provide second phase change material layer 107c. Second phase change material layer 107c is deposited using CVD, ALD, MOCVD, PVD, JVP, or other suitable deposition technique.

Electrode material, such as TiN, TaN, W, Al, Cu, TiSiN, TaSiN, or other suitable electrode material, is deposited over second phase change material layer 107c to provide second electrode material layer 113a. Second electrode material layer 113a is deposited using CVD, ALD, MOCVD, PVD, JVP, or other suitable deposition technique.

Figure 8A:
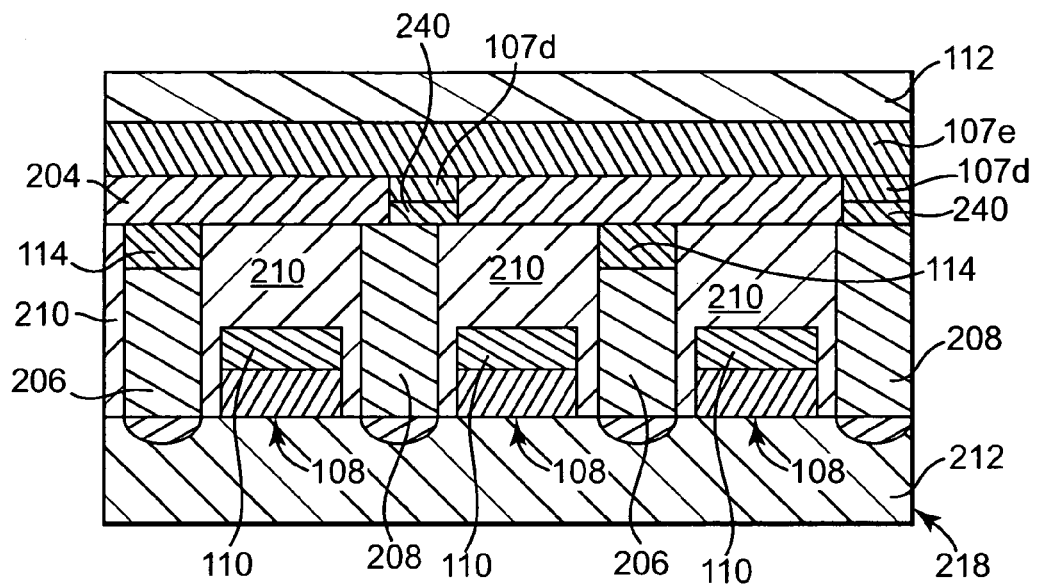
FIG. 8A illustrates a cross-sectional view of one embodiment of the preprocessed wafer, bottom electrodes, first phase change material layer, a second phase change material layer, and bit lines after etching.
Figure 8B:
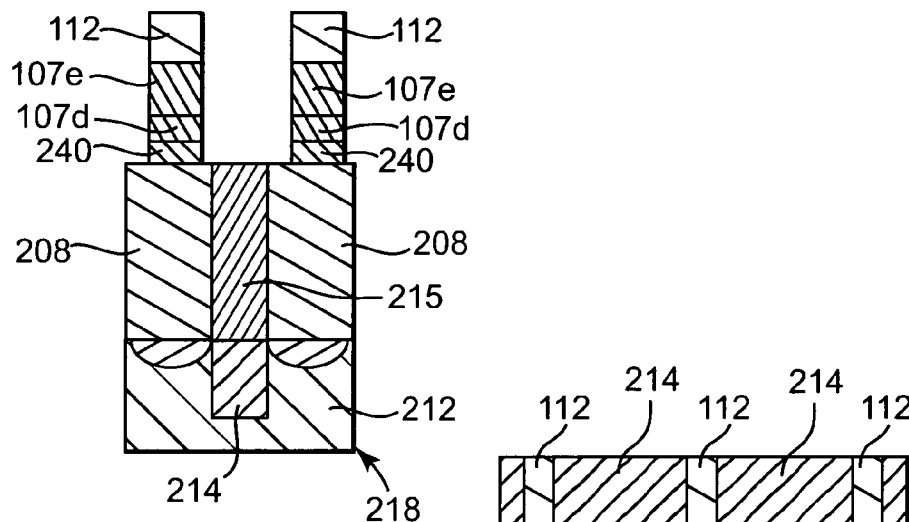
FIG. 8B illustrates a perpendicular cross-sectional view of the wafer illustrated in FIG. 8A.
Figure 8C:
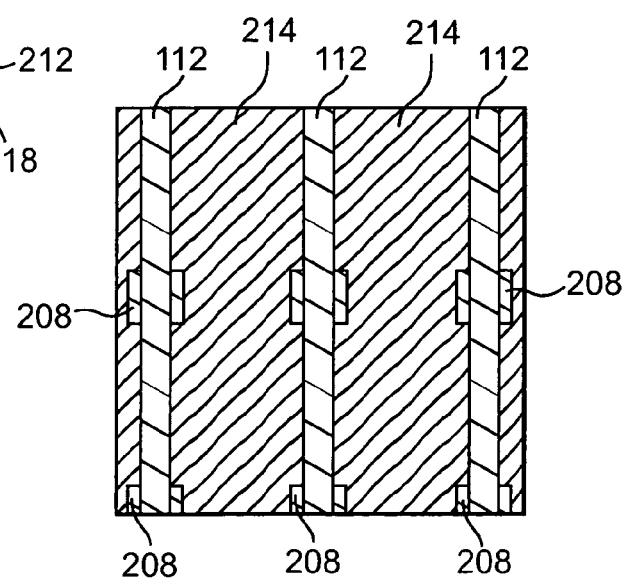
FIG. 8C illustrates a top view of the wafer illustrated in FIG. 8A.

FIG. 8A illustrates a cross-sectional view of one embodiment of preprocessed wafer 218, bottom electrodes 240, first phase change material layer 107d, dielectric material layer 204, second phase change material layer 107e, and bit lines 112 after etching second electrode material layer 113a, second phase change material layer 107c, first phase change material layer 107b, dielectric material layer 204a, and first electrode material layer 240b. FIG. 8B illustrates a perpendicular cross-sectional view of the wafer illustrated in FIG. 8A, and FIG. 8C illustrates a top view of the wafer illustrated in FIG. 8A. Second electrode material layer 113a, second phase change material layer 107c, first phase change material layer 107b, dielectric material layer 204a, and first electrode material layer 240b are etched to provide bit lines 112, second phase change material layer 107e, which is self-aligned to bit lines 112, first phase change material layer 107d, which is self-aligned to bit lines 112, bottom electrodes 240, which are self-aligned to bit lines 112, and dielectric material layer 204. Line lithography is used to pattern bit lines 112 and lines of second phase change material 107e perpendicular to lines of phase change material 107b such that each bottom electrode 240 contacts a second contact 208. The line lithography does not need to be precisely centered over second contacts 208 as long as a portion of each bottom electrode 240 contacts a second contact 208. In this way, the line lithography is less critical yet the desired memory cell size is obtained.

Dielectric material, such as $SiO_2$, FSG, BPSG, BSG, or other suitable dielectric material, is deposited over exposed portions of bit lines 112, second phase change material layer 107e, first phase change material layer 107d, dielectric material layer 204, bottom electrodes 240, and preprocessed wafer 218. The dielectric material layer is deposited using CVD, ALD, MOCVD, PVD, JVP, HDP, or other suitable deposition technique. The dielectric material layer is planarized to expose bit lines 112 and provide dielectric material layer 216. The dielectric material layer is planarized using CMP or another suitable planarization technique to provide array of phase change memory cells 200a illustrated in FIGS. 2A-2C.

Figure 9A:
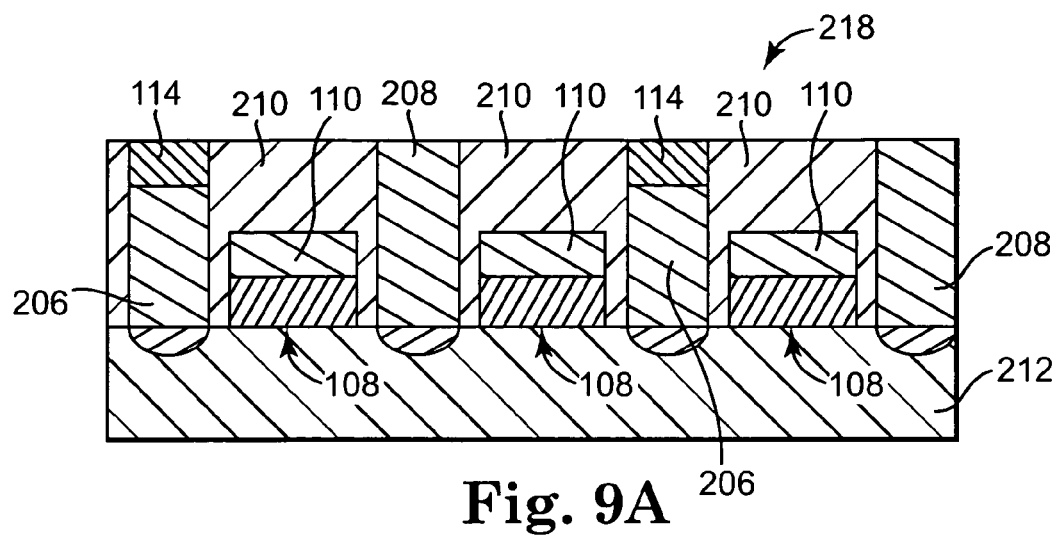
FIG. 9A illustrates a cross-sectional view of one embodiment of a preprocessed wafer.
Figure 9B:
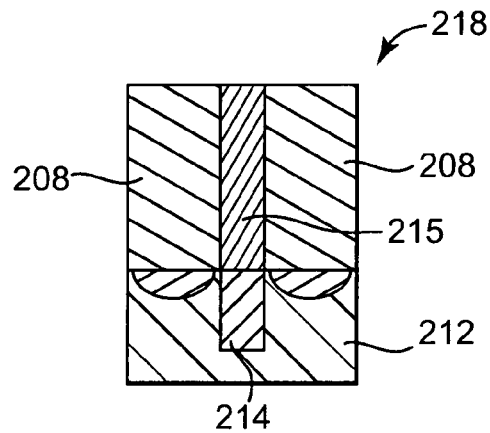
FIG. 9B illustrates a perpendicular cross-sectional view of the preprocessed wafer illustrated in FIG. 9A.
Figures 9C, 9D:
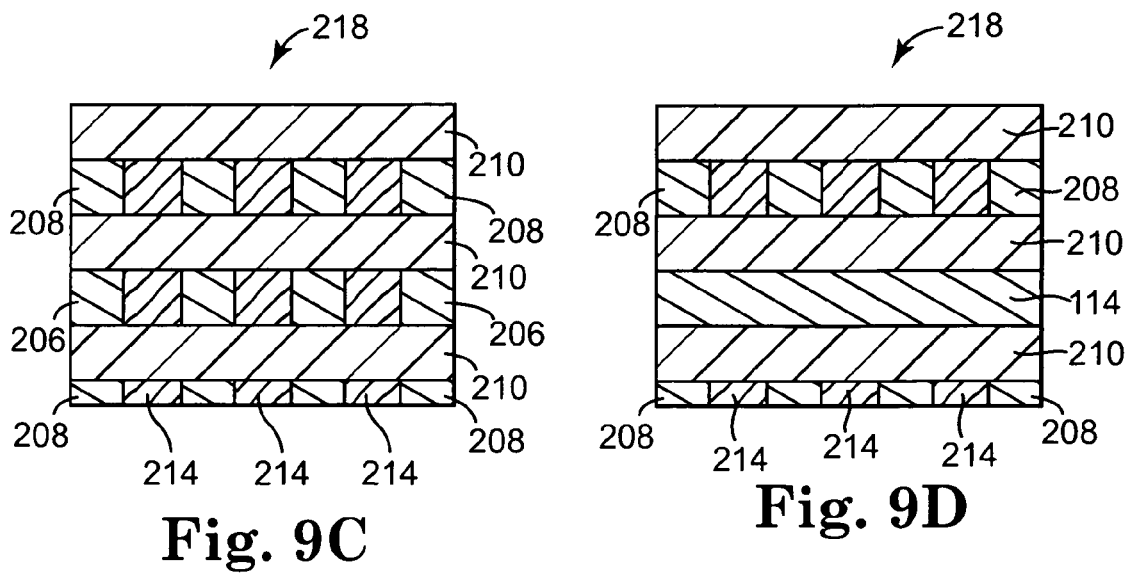
FIG. 9C illustrates a top cross-sectional view of the preprocessed wafer illustrated in FIG. 9A.
FIG. 9D illustrates a top view of the preprocessed wafer illustrated in FIG. 9A.

FIG. 9A illustrates a cross-sectional view of one embodiment of a preprocessed wafer 218. FIG. 9B illustrates a perpendicular cross-sectional view of preprocessed wafer 218 illustrated in FIG. 9A. FIG. 9C illustrates a top cross-sectional view of preprocessed wafer 218 illustrated in FIG. 9A. FIG. 9D illustrates a top view of preprocessed wafer 218 illustrated in FIG. 9A. Preprocessed wafer 218 includes substrate 212, transistors 108, word lines 110, first contacts 206, second contacts 208, ground lines 114, STI 214, ILD 215, and dielectric material 210.

Transistors 108 are formed in substrate 212 in rows and columns. The gates of transistors 108 are electrically coupled to word lines 110. Dielectric material 210 is deposited over transistors 108 and word lines 110. First contacts 206 electrically couple one side of the source-drain path of each transistor 108 to a ground line 114. Second contacts 208 are electrically coupled to the other side of the source-drain path of each transistor 108. STI 214 insulates transistors 108 from adjacent transistors 108, and ILD 215 insulates second contacts 208 from adjacent second contacts 208.

First contacts 206 and second contacts 208 are contact plugs, such as W plugs, Cu plugs, or other suitable conducting material plugs. Word lines 110 comprise doped poly-Si, W, TiN, NiSi, CoSi, TiSi, $WSi_x$, or another suitable material. Ground lines 114 comprise W, Al, Cu, or other suitable material. Dielectric material 210 comprises SiN or other suitable material that enables a borderless contact formation process for first contacts 206 and second contacts 208. STI 214 and ILD 215 comprise $SiO_2$, fluorinated silica glass (FSG), boro-phosphorous silicate glass (BPSG), boro-silicate glass (BSG), or other suitable dielectric material. Word lines 110 are parallel to ground lines 114. Word lines 110 and ground lines 114 are perpendicular to STI 214 and ILD 215.

Figure 10:
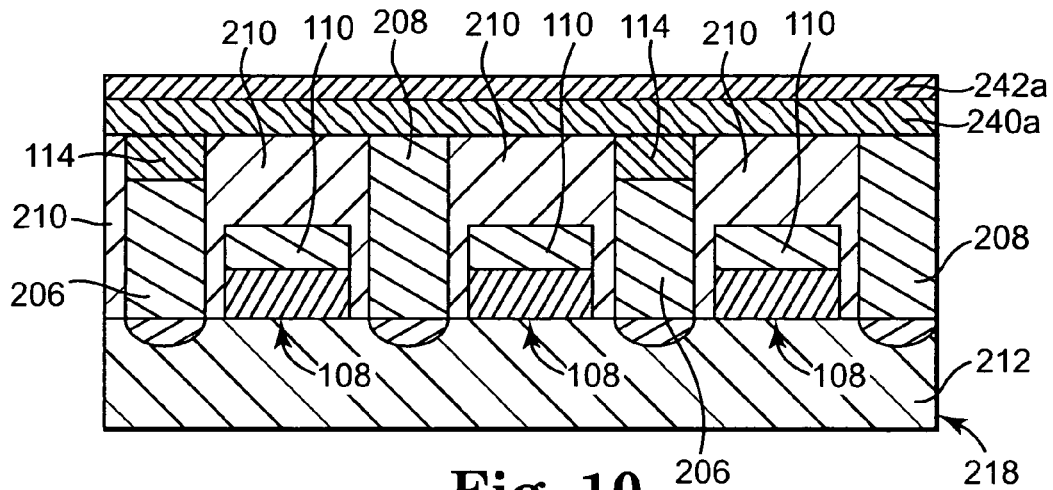
FIG. 10 illustrates a cross-sectional view of one embodiment of the preprocessed wafer, a first electrode material layer, and a hardmask material layer.

FIG. 10 illustrates a cross-sectional view of one embodiment of preprocessed wafer 218, a first electrode material layer 240a, and a hardmask material layer 242a. Electrode material, such as TiN, TaN, W, Al, Cu, TiSiN, TaSiN, or other suitable electrode material, is deposited over preprocessed wafer 218 to provide first electrode material layer 240a. First electrode material layer 240a is deposited using CVD, ALD, MOCVD, PVD, JVP, or other suitable deposition technique.

Figure 11:
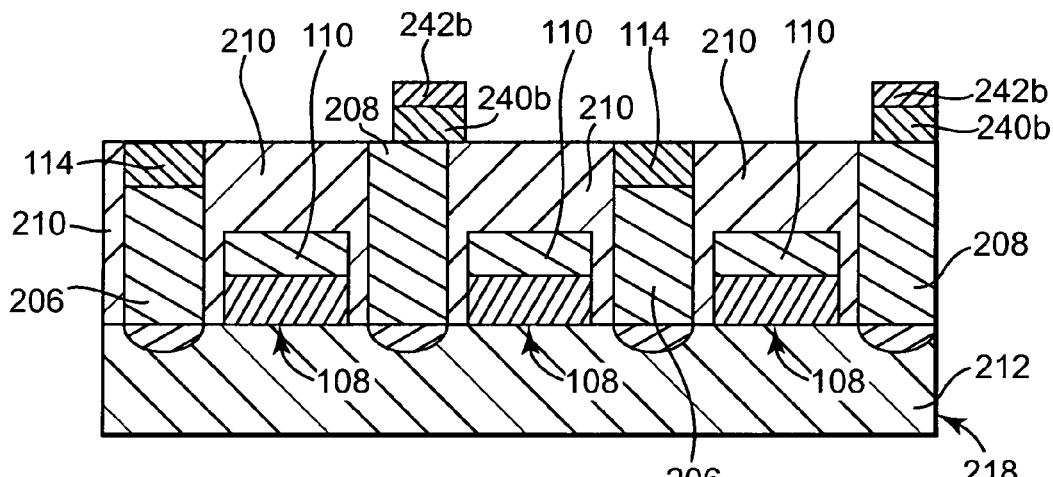
FIG. 11 illustrates a cross-sectional view of one embodiment of the preprocessed wafer, first electrode material layer, and hardmask material layer after etching.

Hardmask material, such as SiO₂, SiN, SiON, C, or other suitable hardmask material is deposited over first electrode material layer 240a to provide hardmask material layer 242a. Hardmask material layer 242a is deposited using CVD, ALD, MOCVD, PVD, JVP, or other suitable deposition technique FIG. 11 illustrates a cross-sectional view of one embodiment of preprocessed wafer 218, first electrode material layer 240b, and hardmask material layer 242b after etching hardmask material layer 242a and first electrode material layer 240a. Hardmask material layer 242a and first electrode material layer 240a are etched to provide hardmask material layer 242b and first electrode material layer 240b, which is self-aligned to hardmask material layer 242b. Line lithography is used to pattern lines of hardmask material 242b and first electrode material 240b contacting second contacts 208. The line lithography does not need to be precisely centered over second contacts 208 as long as a portion of first electrode material 240b contacts second contacts 208. In this way, the line lithography is less critical yet the desired memory cell size is obtained.

Figure 12:
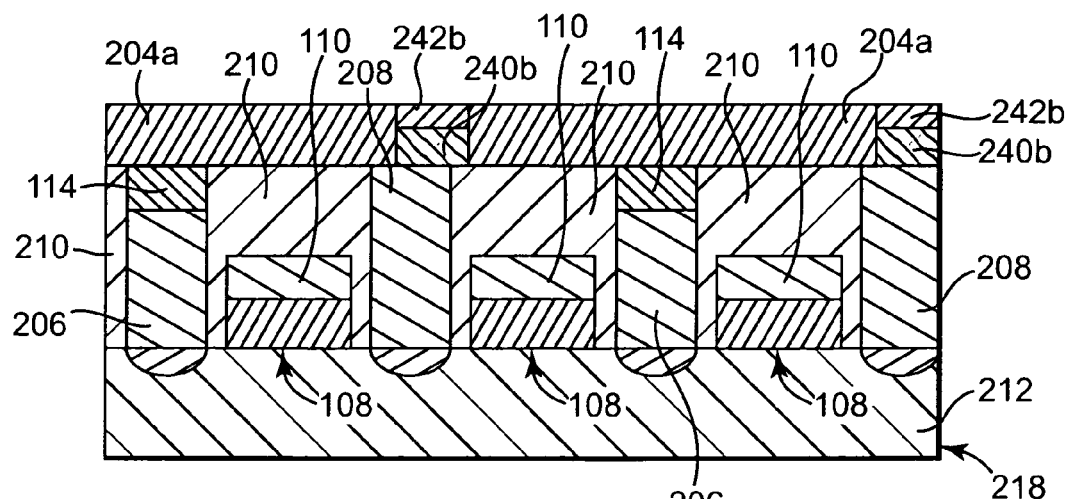
FIG. 12 illustrates a cross-sectional view of one embodiment of the preprocessed wafer, first electrode material layer, hardmask material layer, and a dielectric material layer.

FIG. 12 illustrates a cross-sectional view of one embodiment of preprocessed wafer 218, first electrode material layer 240b, hardmask material layer 242b, and a dielectric material layer 204a. Dielectric material, such as SiO₂, FSG, BPSG, BSG, or other suitable dielectric material, is deposited over exposed portions of hardmask material layer 242b, first electrode material layer 240b, and preprocessed wafer 218. The dielectric material layer is deposited using CVD, ALD, MOCVD, PVD, JVP, HDP, or other suitable deposition technique. The dielectric material layer is planarized to expose hardmask material layer 242b and provide dielectric material layer 204a. The dielectric material layer is planarized using CMP or another suitable planarization technique.

Figure 13A:
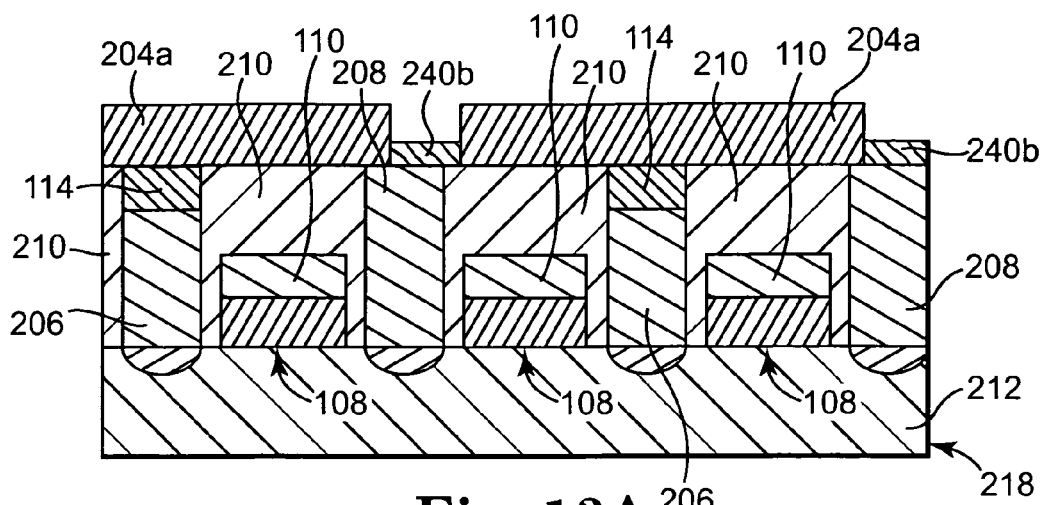
FIG. 13A illustrates a cross-sectional view of one embodiment of the preprocessed wafer, first electrode material layer, and dielectric material layer after removing the hardmask.
Figure 13B:
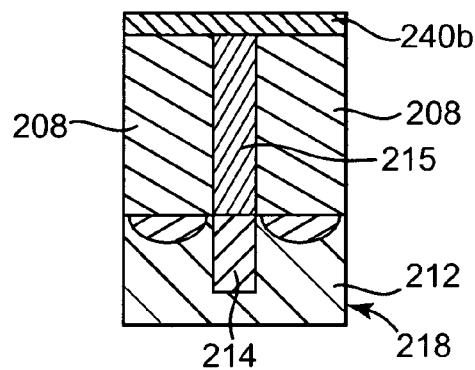
FIG. 13B illustrates a perpendicular cross-sectional view of the wafer illustrated in FIG. 13A.
Figure 13C:
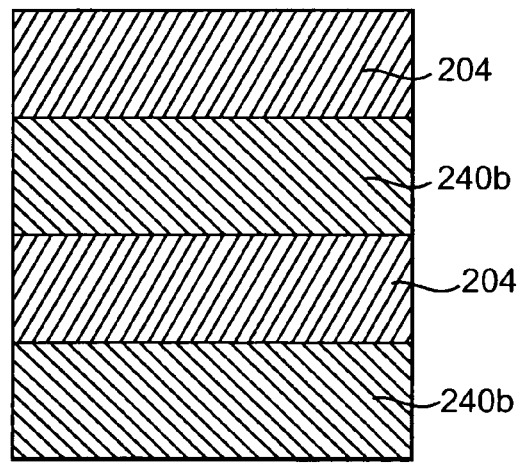
FIG. 13C illustrates a top view of the wafer illustrated in FIG. 13A.

FIG. 13A illustrates a cross-sectional view of one embodiment of preprocessed wafer 218, first electrode material layer 240b, and dielectric material layer 204a after removing hardmask material layer 242b. FIG. 13B illustrates a perpendicular cross-sectional view of the wafer illustrated in FIG. 13A, and FIG. 13C illustrates a top view of the wafer illustrated in FIG. 13A. Hardmask material layer 242b is removed using a wet etch or other suitable technique to expose first electrode material layer 240b.

Figure 14A:
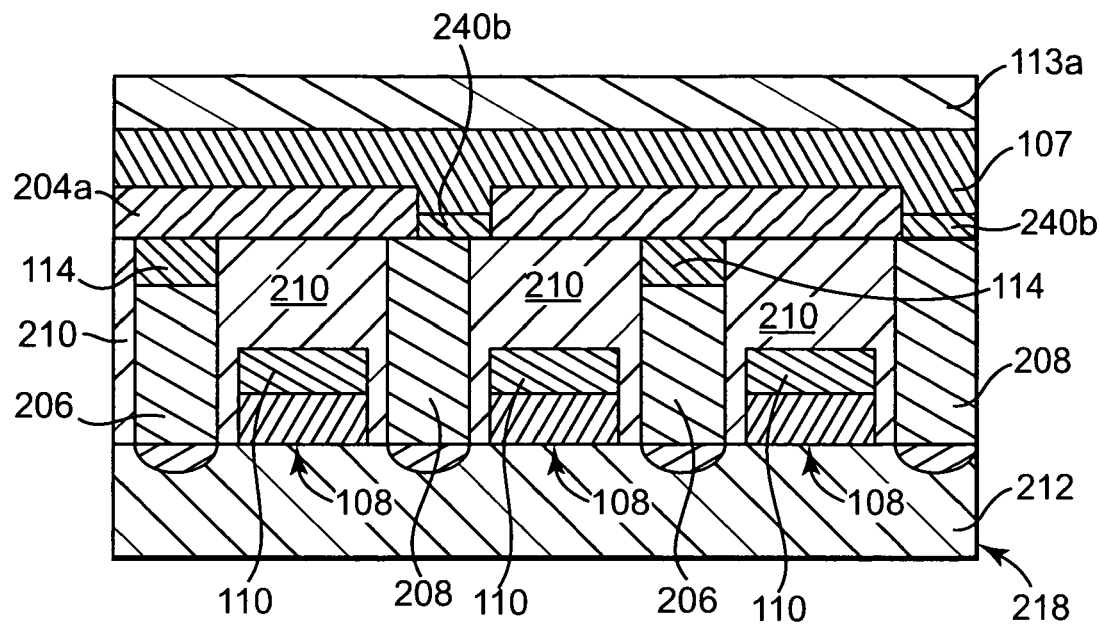
FIG. 14A illustrates a cross-sectional view of one embodiment of the preprocessed wafer, first electrode material layer, dielectric material layer, a phase change material layer, and a second electrode material layer.
Figure 14B:
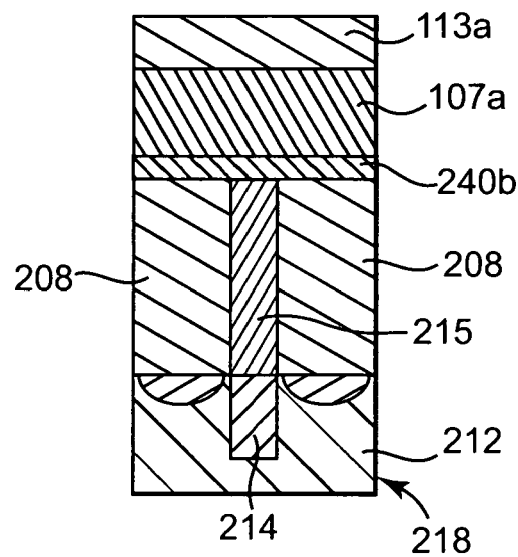
FIG. 14B illustrates a perpendicular cross-sectional view of the wafer illustrated in FIG. 14A.

FIG. 14A illustrates a cross-sectional view of one embodiment of preprocessed wafer 218, first electrode material layer 240b, dielectric material layer 204a, a phase change material layer 107a, and a second electrode material layer 113a. FIG. 14B illustrates a perpendicular cross-sectional view of the wafer illustrated in FIG. 14A. Phase change material, such as a chalcogenide compound material or other suitable phase change material, is deposited over first electrode material layer 240b and dielectric material layer 204a to provide phase change material layer 107a. Phase change material layer 107a is deposited using CVD, ALD, MOCVD, PVD, JVP, or other suitable deposition technique.

Electrode material, such as TiN, TaN, W, Al, Cu, TiSiN, TaSiN, or other suitable electrode material, is deposited over phase change material layer 107a to provide second electrode material layer 113a. Second electrode material layer 113a is deposited using CVD, ALD, MOCVD, PVD, JVP, or other suitable deposition technique.

Figure 15A:
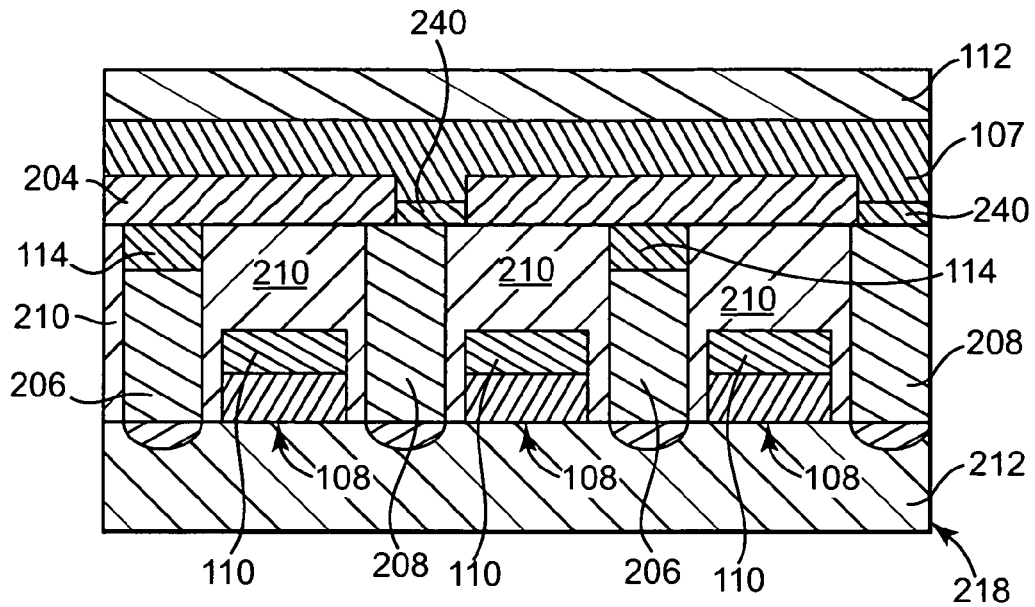
FIG. 15A illustrates a cross-sectional view of one embodiment of the preprocessed wafer, bottom electrodes, dielectric material layer, a phase change material layer, and bit lines after etching.
Figure 15B:
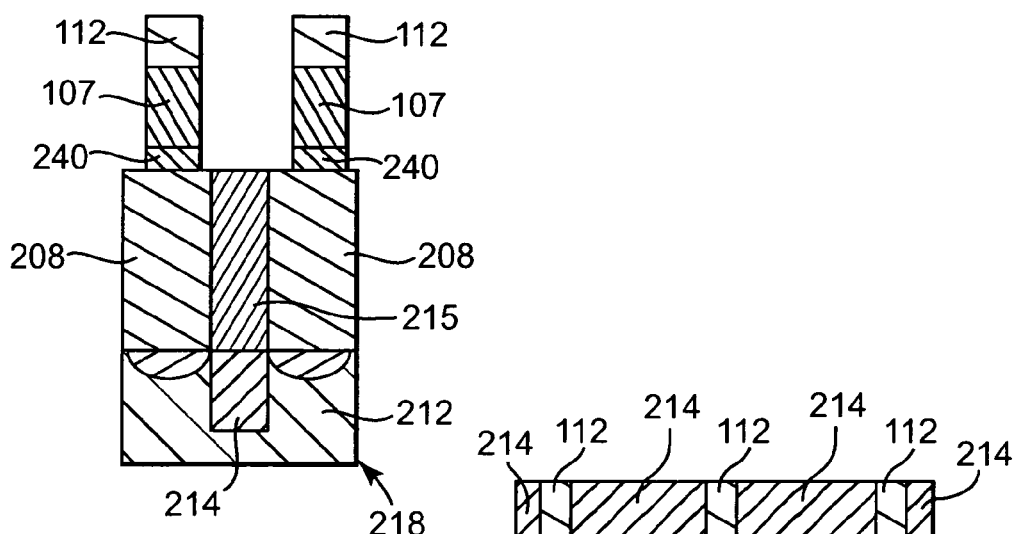
FIG. 15B illustrates a perpendicular cross-sectional view of the wafer illustrated in FIG. 15A.
Figure 15C:
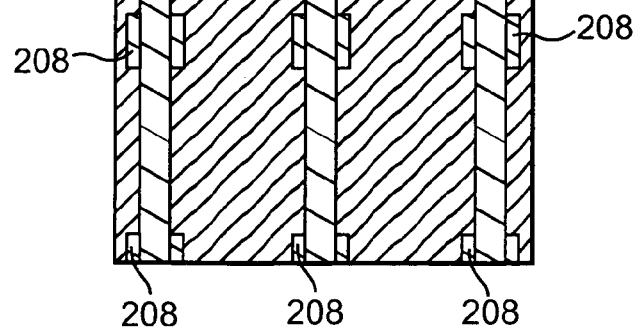
FIG. 15C illustrates a top view of the wafer illustrated in FIG. 15A.

FIG. 15A illustrates a cross-sectional view of one embodiment of preprocessed wafer 218, bottom electrodes 240, dielectric material layer 204, phase change material layer 107, and bit lines 112 after etching second electrode material layer 113a, phase change material layer 107a, dielectric material layer 204a, and first electrode material layer 240b. FIG. 15B illustrates a perpendicular cross-sectional view of the wafer illustrated in FIG. 15A, and FIG. 15C illustrates a top view of the wafer illustrated in FIG. 15A. Second electrode material layer 113a, phase change material layer 107a, dielectric material layer 204a, and first electrode material layer 240b are etched to provide bit lines 112, phase change material layer 107, which is self-aligned to bit lines 112, bottom electrodes 240, which are self-aligned to bit lines 112, and dielectric material layer 204. Line lithography is used to pattern bit lines 112 and lines of phase change material 107 perpendicular to lines of first electrode material 240b such that each bottom electrode 240 contacts a second contact 208. The line lithography does not need to be precisely centered over second contacts 208 as long as a portion of each bottom electrode 240 contacts a second contact 208. In this way, the line lithography is less critical yet the desired memory cell size is obtained.

Dielectric material, such as SiO₂, FSG, BPSG, BSG, or other suitable dielectric material, is deposited over exposed portions of bit lines 112, phase change material layer 107, dielectric material layer 204, bottom electrodes 240, and preprocessed wafer 218. The dielectric material layer is deposited using CVD, ALD, MOCVD, PVD, JVP, HDP, or other suitable deposition technique. The dielectric material layer is planarized to expose bit lines 112 and provide dielectric material layer 216. The dielectric material layer is planarized using CMP or another suitable planarization technique to provide array of phase change memory cells 200a illustrated in FIGS. 2A-2C.

Figure 16A:
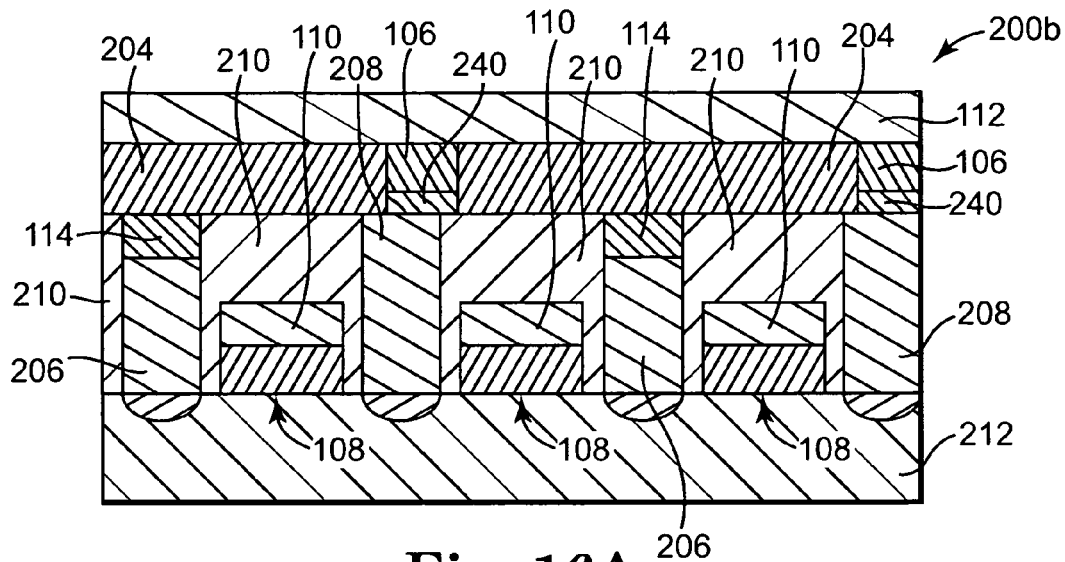
FIG. 16A illustrates a cross-sectional view of another embodiment of an array of phase change memory cells.
Figure 16B:
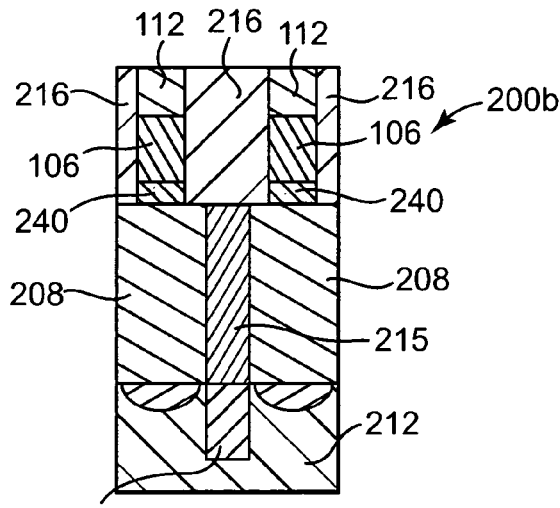
FIG. 16B illustrates a perpendicular cross-sectional view of the array of phase change memory cells illustrated in FIG. 16A.
Figure 16C:
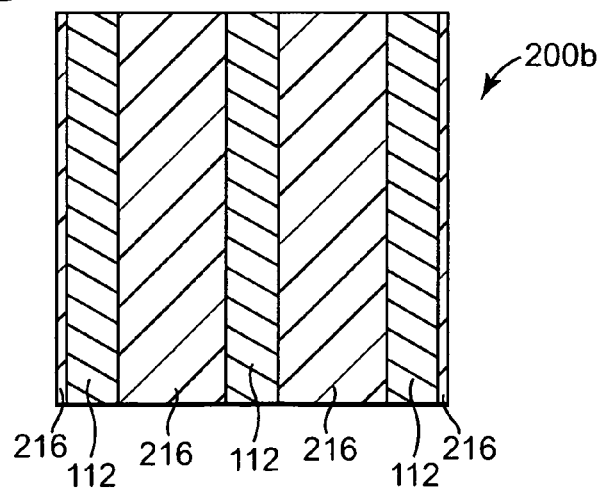
FIG. 16C illustrates a top view of the array of phase change memory cells illustrated in FIG. 16A.

FIG. 16A illustrates a cross-sectional view of another embodiment of an array of phase change memory cells 200b. FIG. 16B illustrates a perpendicular cross-sectional view of array of phase change memory cells 200b illustrated in FIG. 16A. FIG. 16C illustrates a top view of array of phase change memory cells 200b illustrated in FIG. 16A. In one embodiment, array of phase change memory cells 100 is similar to array of phase change memory cells 200b. Array of phase change memory cells 200b includes substrate 212, transistors 108, word lines 110, first contacts 206, second contacts 208, ground lines 114, bottom electrodes 240, dielectric material 204, 210, and 216, STI 214, ILD 215, phase change elements 106, and bits lines 112. Metal wiring (not shown) follows after the bit line level.

Transistors 108 for selecting phase change elements 106 are formed in substrate 212 in rows and columns. The gates of transistors 108 are electrically coupled to word lines 110. Dielectric material 210 is deposited over transistors 108 and word lines 110. First contacts 206 electrically couple one side of the source-drain path of each transistor 108 to a ground line 114. Second contacts 208 electrically couple the other side of the source-drain path of each transistor 108 to a bottom electrode 240. Each bottom electrode 240 is electrically coupled to a phase change element 106. Each phase change element 106 is electrically coupled to a bit line 112. Bit lines 112 are perpendicular to word lines 110 and ground lines 114. Dielectric material 204 insulates ground lines 114 above first contacts 206. Dielectric material 216 insulates bits lines 112, phase change elements 106, and bottom electrodes 240 from adjacent bit lines 112, phase change elements 106, and bottom electrodes 240. STI 214 insulates transistors 108 from adjacent transistors 108, and ILD 215 insulates second contacts 208 from adjacent second contacts 208.

Phase change elements 106 and bottom electrodes 240 are self-aligned to bit lines 112. The self-alignment minimizes critical lithography steps in the fabrication of array of phase change memory cells 200b. In addition, with self-alignment the interface resistances between bottom electrodes 240 and phase change elements 106 and between phase change elements 106 and bit lines 112 is overlay insensitive and parasitic resistances are minimized.

In one embodiment, array of phase change memory cells 200b is scalable to $8F^2$ for dual gate memory cells, where "F" is the minimum feature size, or to $6F^2$ for single gate memory cells. In the embodiment for single gate memory cells, an active gate of a transistor 108 between every two adjacent memory cells is replaced with an isolation gate. One embodiment of a method for fabricating array of phase change memory cells 200b is described and illustrated with reference to the following FIGS. 17A-22C.

Figure 17A:
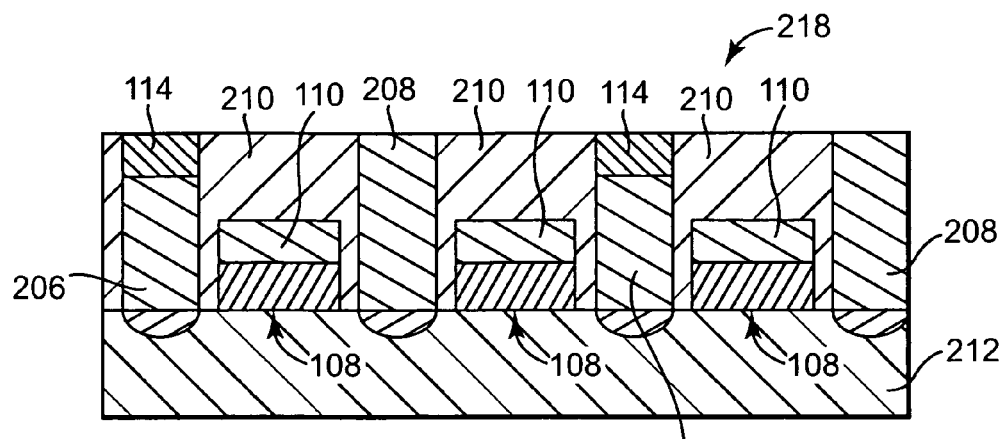
FIG. 17A illustrates a cross-sectional view of one embodiment of a preprocessed wafer.
Figure 17B:
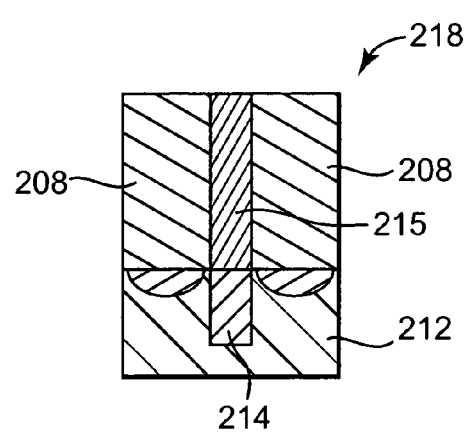
FIG. 17B illustrates a perpendicular cross-sectional view of the preprocessed wafer illustrated in FIG. 17A.
Figures 17C, 17D:
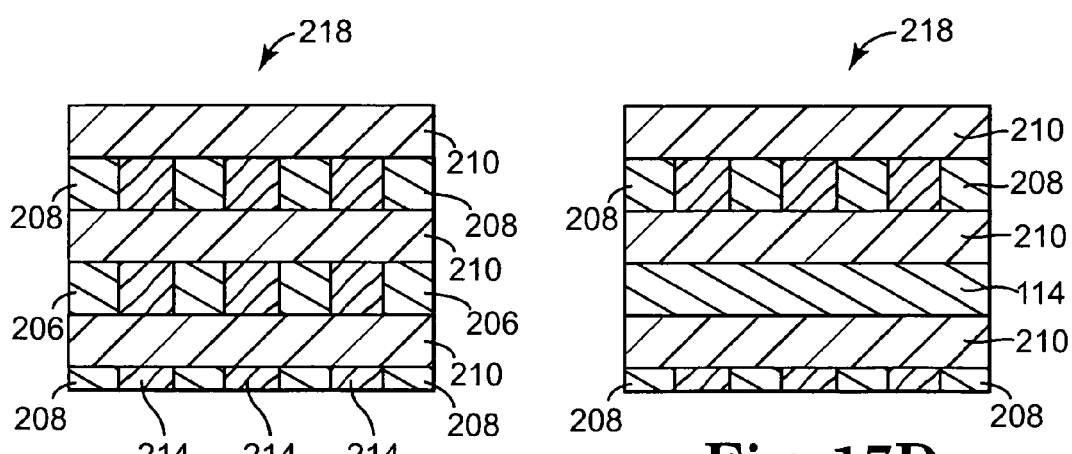
FIG. 17C illustrates a top cross-sectional view of the preprocessed wafer illustrated in FIG. 17A.
FIG. 17D illustrates a top view of the preprocessed wafer illustrated in FIG. 17A.

FIG. 17A illustrates a cross-sectional view of one embodiment of a preprocessed wafer 218. FIG. 17B illustrates a perpendicular cross-sectional view of preprocessed wafer 218 illustrated in FIG. 17A. FIG. 17C illustrates a top cross-sectional view of preprocessed wafer 218 illustrated in FIG. 17A. FIG. 17D illustrates a top view of preprocessed wafer 218 illustrated in FIG. 17A. Preprocessed wafer 218 includes substrate 212, transistors 108, word lines 110, first contacts 206, second contacts 208, ground lines 114, STI 214, ILD 215, and dielectric material 210.

Transistors 108 are formed in substrate 212 in rows and columns. The gates of transistors 108 are electrically coupled to word lines 110. Dielectric material 210 is deposited over transistors 108 and word lines 110. First contacts 206 electrically couple one side of the source-drain path of each transistor 108 to a ground line 114. Second contacts 208 are electrically coupled to the other side of the source-drain path of each transistor 108. STI 214 insulates transistors 108 from adjacent transistors 108, and ILD 215 insulates second contacts 208 from adjacent second contacts 208.

First contacts 206 and second contacts 208 are contact plugs, such as W plugs, Cu plugs, or other suitable conducting material plugs. Word lines 110 comprise doped poly-Si, W, TiN, NiSi, CoSi, TiSi, $WSi_x$, or another suitable material. Ground lines 114 comprise W, Al, Cu, or other suitable material. Dielectric material 210 comprises SiN or other suitable material that enables a borderless contact formation process for first contacts 206 and second contacts 208. STI 214 and ILD 215 comprise $SiO_2$, FSG, BPSG, BSG, or other suitable dielectric material. Word lines 110 are parallel to ground lines 114. Word lines 110 and ground lines 114 are perpendicular to STI 214 and ILD 215.

Figure 18:
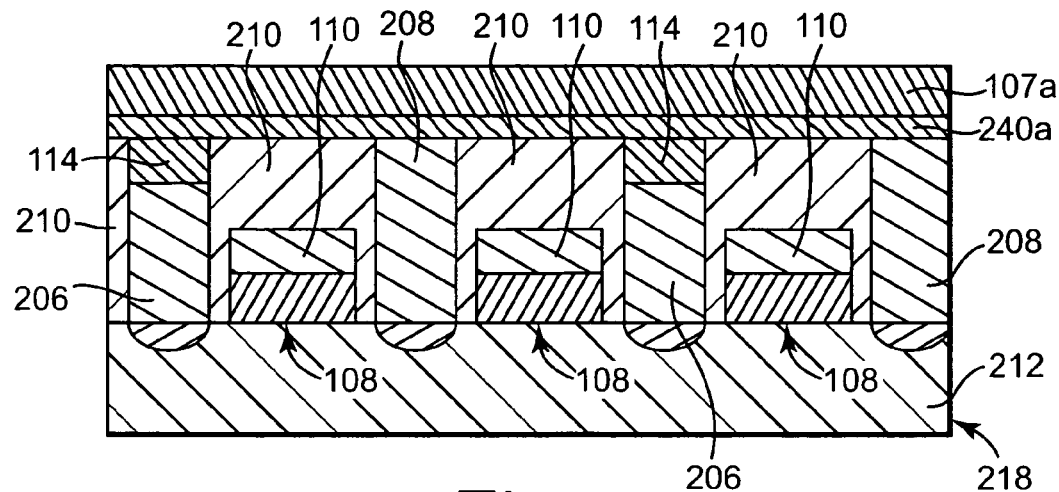
FIG. 18 illustrates a cross-sectional view of one embodiment of the preprocessed wafer, a first electrode material layer, and a phase change material layer.

FIG. 18 illustrates a cross-sectional view of one embodiment of preprocessed wafer 218, a first electrode material layer 240a, and a phase change material layer 107a. Electrode material, such as TiN, TaN, W, Al, Cu, TiSiN, TaSiN, or other suitable electrode material, is deposited over preprocessed wafer 218 to provide first electrode material layer 240a. First electrode material layer 240a is deposited using CVD, ALD, MOCVD, PVD, JVP, or other suitable deposition technique.

Phase change material, such as a chalcogenide compound material or other suitable phase change material, is deposited over first electrode material layer 240a to provide phase change material layer 107a. Phase change material layer 107a is deposited using CVD, ALD, MOCVD, PVD, JVP, or other suitable deposition technique. In one embodiment, an optional hardmask material layer is deposited over phase change material layer 107a.

Figure 19:
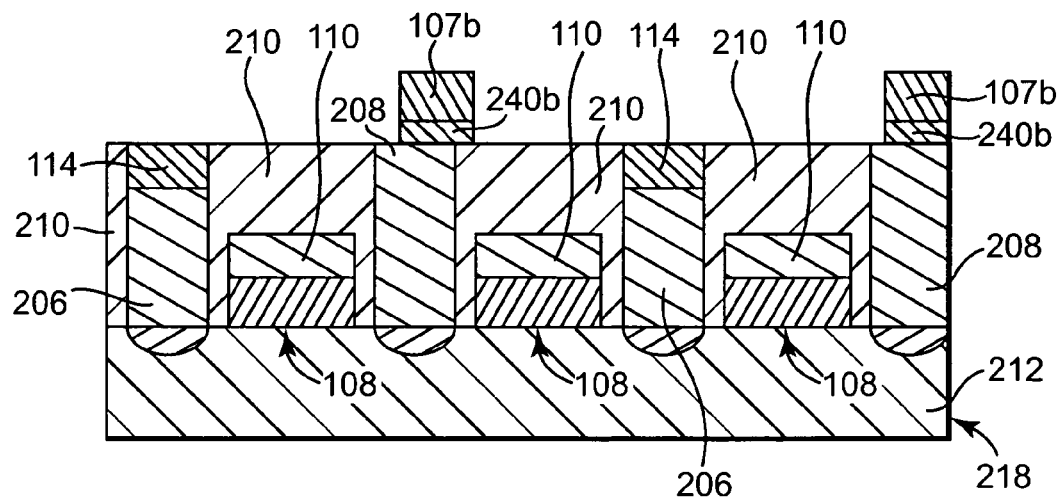
FIG. 19 illustrates a cross-sectional view of one embodiment of the preprocessed wafer, first electrode material, and phase change material layer after etching.

FIG. 19 illustrates a cross-sectional view of one embodiment of preprocessed wafer 218, first electrode material layer 240b, and phase change material layer 107b after etching phase change material layer 107a and first electrode material layer 240a. Phase change material layer 107a and first electrode material layer 240a are etched to provide phase change material layer 107b and first electrode material layer 240b, which is self-aligned to phase change material layer 107b. Line lithography is used to pattern lines of phase change material 107b and first electrode material 240b contacting second contacts 208. The line lithography does not need to be precisely centered over second contacts 208 as long as a portion of first electrode material 240b contacts second contacts 208. In this way, the line lithography is less critical yet the desired memory cell size is obtained.

In the embodiment where a hardmask material layer is deposited over phase change material layer 107a, the hardmask material layer, phase change material layer 107a, and first electrode material layer 240a are etched to provide an etched hardmask material layer, first phase change material layer 107b, which is self-aligned to the etched hardmask material layer, and first electrode material layer 240b, which is self-aligned to first phase change material layer 107b.

Figure 20A:
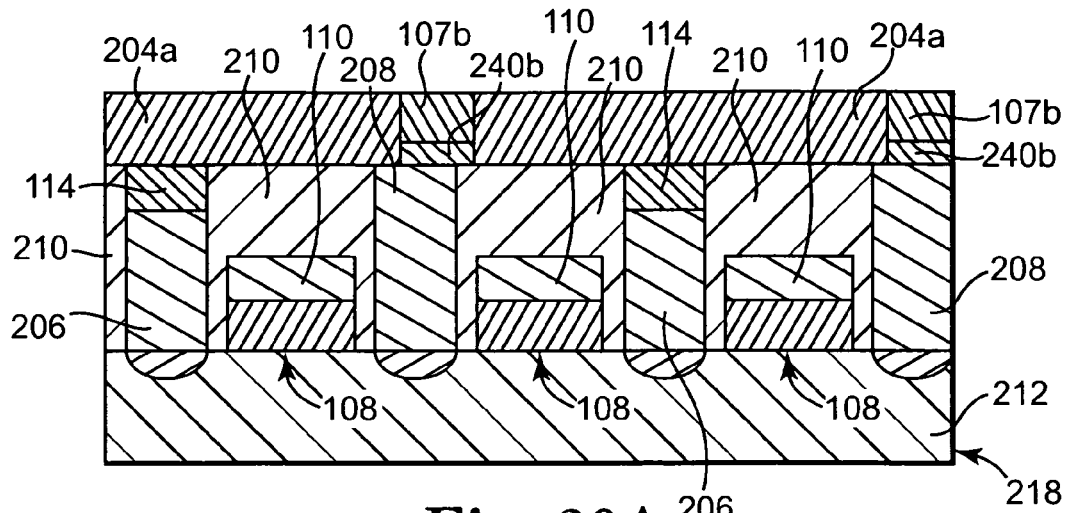
FIG. 20A illustrates a cross-sectional view of one embodiment of the preprocessed wafer, first electrode material layer, phase change material layer, and a dielectric material layer.
Figure 20B:
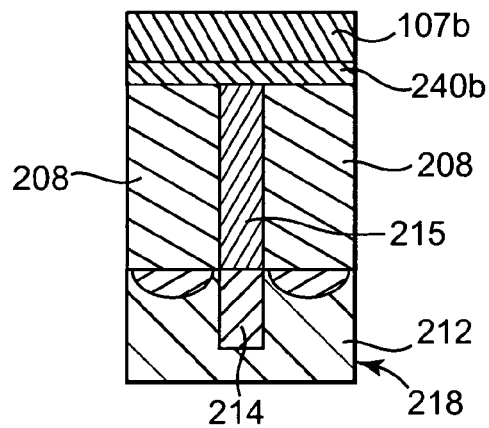
FIG. 20B illustrates a perpendicular cross-sectional view of the wafer illustrated in FIG. 20A.
Figure 20C:
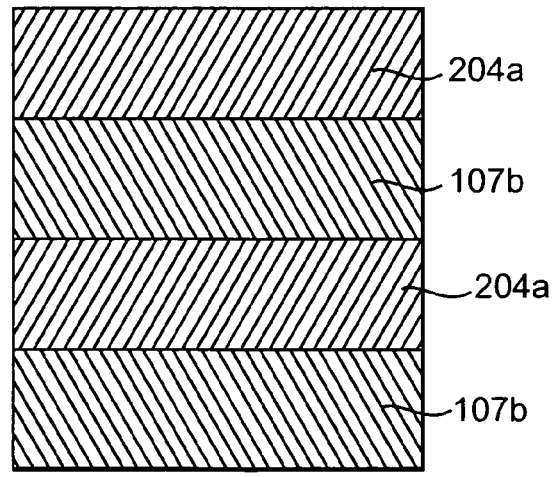
FIG. 20C illustrates a top view of the wafer illustrated in FIG. 20A.

FIG. 20A illustrates a cross-sectional view of one embodiment of preprocessed wafer 218, first electrode material layer 240b, phase change material layer 107b, and a dielectric material layer 204a. FIG. 20B illustrates a perpendicular cross-sectional view of the wafer illustrated in FIG. 20A, and FIG. 20C illustrates a top view of the wafer illustrated in FIG. 20A. Dielectric material, such as $SiO_2$, FSG, BPSG, BSG, or other suitable dielectric material, is deposited over exposed portions of phase change material layer 107b, first electrode material layer 240b, and preprocessed wafer 218. The dielectric material layer is deposited using CVD, ALD, MOCVD, PVD, JVP, HDP, or other suitable deposition technique. The dielectric material layer is planarized to expose phase change material layer 107b and provide dielectric material layer 204a. The dielectric material layer is planarized using CMP or another suitable planarization technique. In the embodiment where an etched hardmask material layer is over phase change material layer 107b, the dielectric material layer is planarized to expose the hardmask material. The planarized dielectric material layer is optionally recess etched such that the top of the dielectric material layer is aligned with the top of phase change material layer 107b. The hardmask material is then removed using a wet etch or other suitable technique.

Figure 21A:
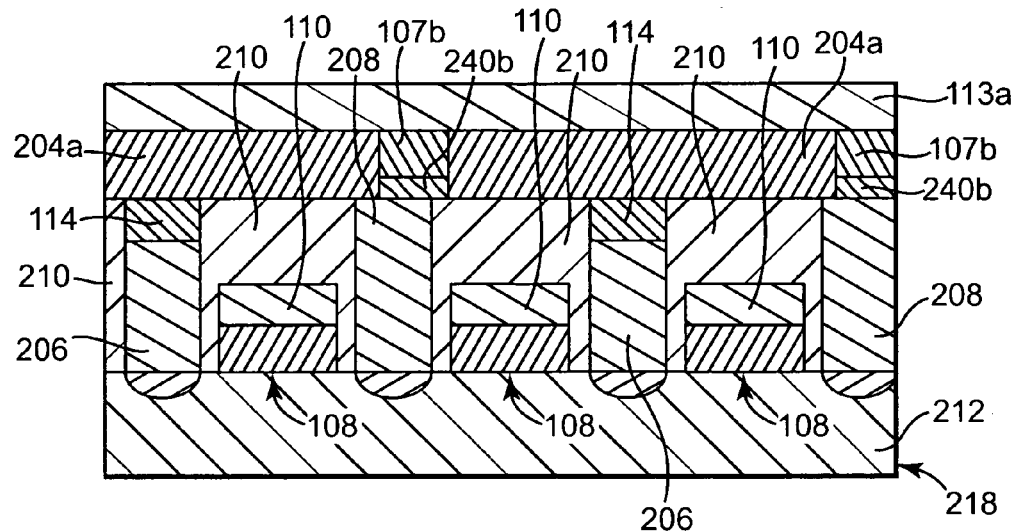
FIG. 21A illustrates a cross-sectional view of one embodiment of the preprocessed wafer, first electrode material layer, phase change material layer, dielectric material layer, and a second electrode material layer.
Figure 21B:
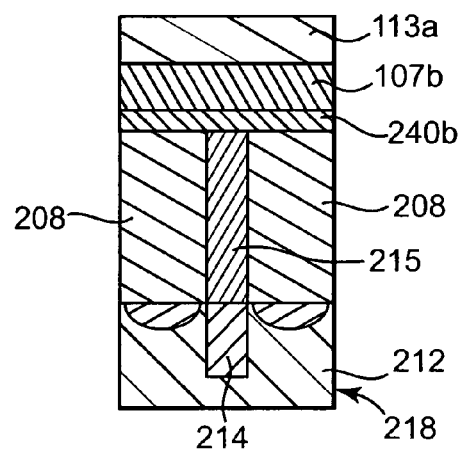
FIG. 21B illustrates a perpendicular cross-sectional view of the wafer illustrated in FIG. 21A.

FIG. 21A illustrates a cross-sectional view of one embodiment of preprocessed wafer 218, first electrode material layer 240b, phase change material layer 107b, dielectric material layer 204a, and a second electrode material layer 113a. FIG. 21B illustrates a perpendicular cross-sectional view of the wafer illustrated in FIG. 21A. Electrode material, such as TiN, TaN, W, Al, Cu, TiSiN, TaSiN, or other suitable electrode material, is deposited over phase change material layer 107b and dielectric material layer 204a to provide second electrode material layer 113a. Second electrode material layer 113a is deposited using CVD, ALD, MOCVD, PVD, JVP, or other suitable deposition technique.

Figure 22A:
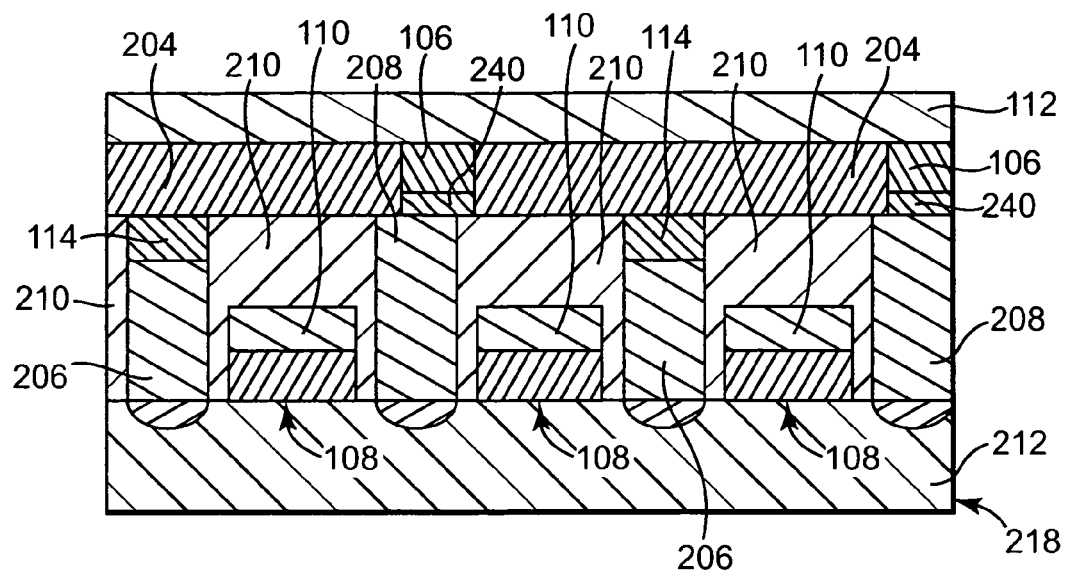
FIG. 22A illustrates a cross-sectional view of one embodiment of the preprocessed wafer, bottom electrodes, phase change elements, and bit lines after etching.
Figure 22B:
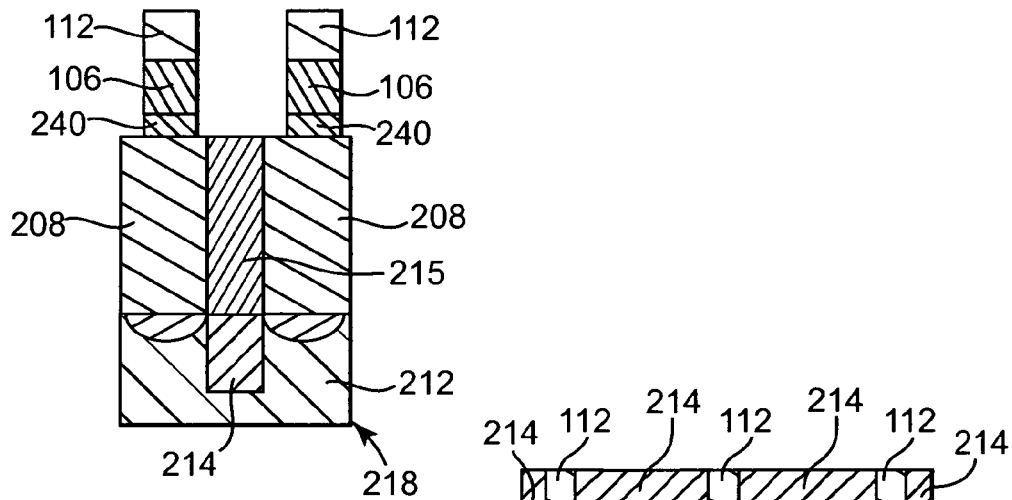
FIG. 22B illustrates a perpendicular cross-sectional view of the wafer illustrated in FIG. 22A.
Figure 22C:
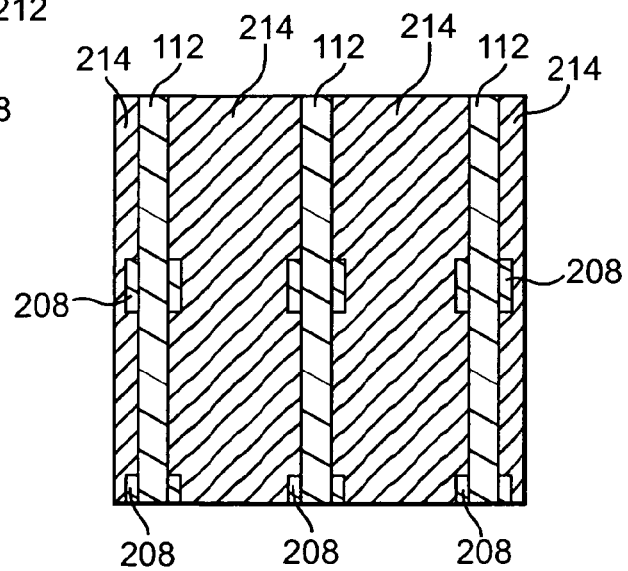
FIG. 22C illustrates a top view of the wafer illustrated in FIG. 22A.

FIG. 22A illustrates a cross-sectional view of one embodiment of preprocessed wafer 218, bottom electrodes 240, phase change elements 106, dielectric material layer 204, and bit lines 112 after etching second electrode material layer 113a, phase change material layer 107b, dielectric material layer 204a, and first electrode material layer 240b. FIG. 22B illustrates a perpendicular cross-sectional view of the wafer illustrated in FIG. 22A, and FIG. 22C illustrates a top view of the wafer illustrated in FIG. 22A. Second electrode material layer 113a, phase change material layer 107b, dielectric material layer 204a, and first electrode material layer 240b are etched to provide bit lines 112, phase change elements 106, which are self-aligned to bit lines 112, bottom electrodes 240, which are self-aligned to bit lines 112, and dielectric material layer 204. Line lithography is used to pattern bit lines 112 perpendicular to lines of first electrode material 240b such that each bottom electrode 240 contacts a second contact 208. The line lithography does not need to be precisely centered over second contacts 208 as long as a portion of each bottom electrode 240 contacts a second contact 208. In this way, the line lithography is less critical yet the desired memory cell size is obtained.

Dielectric material, such as $SiO_2$, FSG, BPSG, BSG, or other suitable dielectric material, is deposited over exposed portions of bit lines 112, phase change elements 106, dielectric material layer 204, bottom electrodes 240, and preprocessed wafer 218. The dielectric material layer is deposited using CVD, ALD, MOCVD, PVD, JVP, HDP, or other suitable deposition technique. The dielectric material layer is planarized to expose bit lines 112 and provide dielectric material layer 216. The dielectric material layer is planarized using CMP or another suitable planarization technique to provide array of phase change memory cells 200b illustrated in FIGS. 16A-16C.

FIG. 23A illustrates a cross-sectional view of another embodiment of an array of phase change memory cells 200c. FIG. 23B illustrates a perpendicular cross-sectional view of array of phase change memory cells 200c illustrated in FIG. 23A. FIG. 23C illustrates a top view of array of phase change memory cells 200c illustrated in FIG. 23A. In one embodiment, array of phase change memory cells 100 is similar to array of phase change memory cells 200c. Array of phase change memory cells 200c includes substrate 212, transistors 108, word lines 110, first contacts 206, second contacts 208, ground lines 114, bottom electrodes 240, dielectric material 204, 210, and 216, STI 214, ILD 215, phase change elements 106, top electrodes 250, and bits lines 112. Metal wiring (not shown) follows after the bit line level.

Transistors 108 for selecting phase change elements 106 are formed in substrate 212 in row and columns. The gates of transistors 108 are electrically coupled to word lines 110. Dielectric material 210 is deposited over transistors 108 and word lines 110. First contacts 206 electrically couple one side of the source-drain path of each transistor 108 to a ground line 114. Second contacts 208 electrically couple the other side of the source-drain path of each transistor 108 to a bottom electrode 240. Each bottom electrode 240 is electrically coupled to a phase change element 106. Each phase change element 106 is electrically coupled to a top electrode 250. Each top electrode 250 is electrically coupled to a bit line 112. Bit lines 112 are perpendicular to word lines 110 and ground lines 114. Dielectric material 204 insulates ground lines 114 above first contacts 206. Dielectric material 216 insulates bits lines 112, top electrodes 250, phase change elements 106, and bottom electrodes 240 from adjacent bit lines 112, top electrodes 250, phase change elements 106, and bottom electrodes 240. STI 214 insulates transistors 108 from adjacent transistors 108, and ILD 215 insulates second contacts 208 from adjacent second contacts 208.

Top electrodes 250, phase change elements 106, and bottom electrodes 240 are self-aligned to bit lines 112. The self-alignment minimizes critical lithography steps in the fabrication of array of phase change memory cells 200c. In addition, with self-alignment the interface resistances between bottom electrodes 240 and phase change elements 106 and between phase change elements 106 and top electrodes 250 is overlay insensitive and parasitic resistances are minimized.

In one embodiment, array of phase change memory cells 200c is scalable to $8F^2$ for dual gate memory cells, where "F" is the minimum feature size, or to $6F^2$ for single gate memory cells. In the embodiment for single gate memory cells, an active gate of a transistor 108 between every two adjacent memory cells is replaced with an isolation gate. One embodiment of a method for fabricating array of phase change memory cells 200c is described and illustrated with reference to the following FIGS. 24A-29C.

Figure 24A:
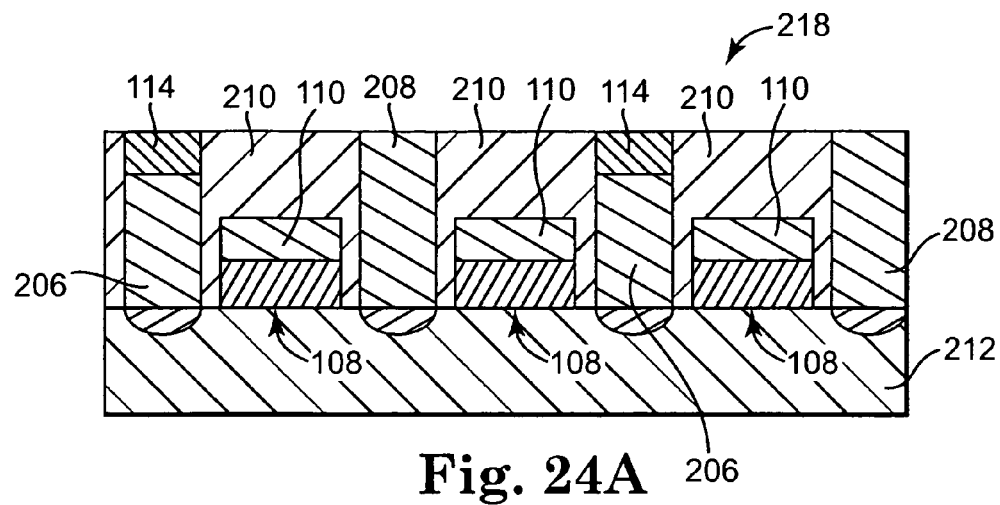
FIG. 24A illustrates a cross-sectional view of one embodiment of a preprocessed wafer.
Figure 24B:
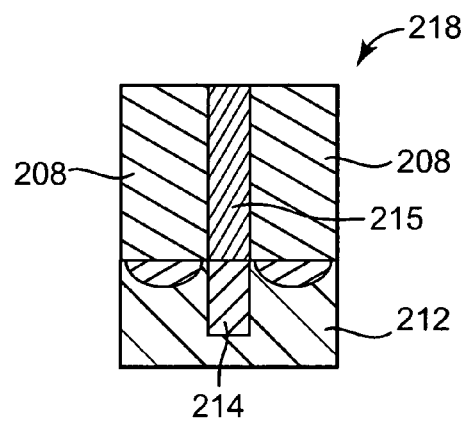
FIG. 24B illustrates a perpendicular cross-sectional view of the preprocessed wafer illustrated in FIG. 24A.
Figures 24C, 24D:
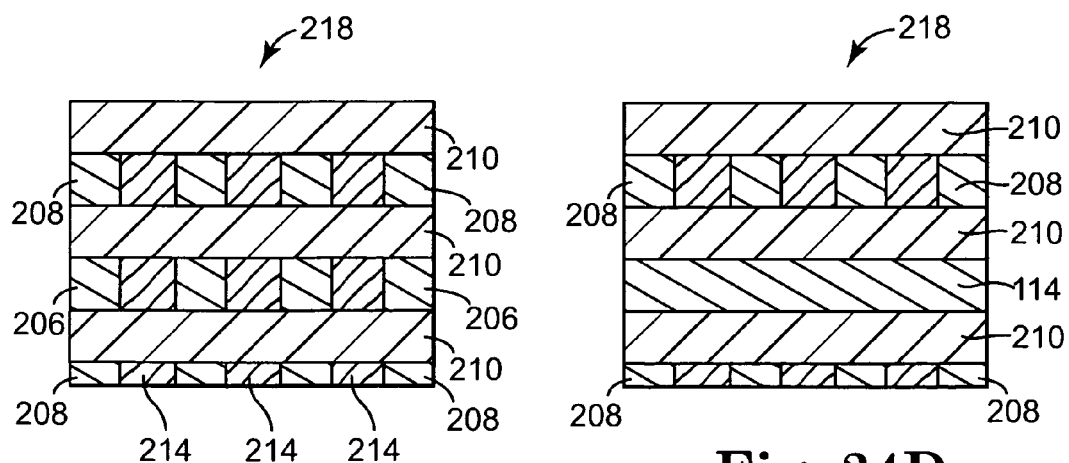
FIG. 24C illustrates a top cross-sectional view of the preprocessed wafer illustrated in FIG. 24A.
FIG. 24D illustrates a top view of the preprocessed wafer illustrated in FIG. 24A.

FIG. 24A illustrates a cross-sectional view of one embodiment of a preprocessed wafer 218. FIG. 24B illustrates a perpendicular cross-sectional view of preprocessed wafer 218 illustrated in FIG. 24A. FIG. 24C illustrates a top cross-sectional view of preprocessed wafer 218 illustrated in FIG. 24A. FIG. 24D illustrates a top view of preprocessed wafer 218 illustrated in FIG. 24A. Preprocessed wafer 218 includes substrate 212, transistors 108, word lines 110, first contacts 206, second contacts 208, ground lines 114, STI 214, ILD 215, and dielectric material 210.

Transistors 108 are formed in substrate 212 in rows and columns. The gates of transistors 108 are electrically coupled to word lines 110. Dielectric material 210 is deposited over transistors 108 and word lines 110. First contacts 206 electrically couple one side of the source-drain path of each transistor 108 to a ground line 114. Second contacts 208 are electrically coupled to the other side of the source-drain path of each transistor 108. STI 214 insulates transistors 108 from adjacent transistors 108, and ILD 215 insulates second contacts 208 from adjacent second contacts 208.

First contacts 206 and second contacts 208 are contact plugs, such as W plugs, Cu plugs, or other suitable conducting material plugs. Word lines 110 comprise doped poly-Si, W, TiN, NiSi, CoSi, TiSi, $WSi_x$, or another suitable material. Ground lines 114 comprise W, Al, Cu, or other suitable material. Dielectric material 210 comprises SiN or other suitable material that enables a borderless contact formation process for first contacts 206 and second contacts 208. STI 214 and ILD 215 comprise $SiO_2$, FSG, BPSG, BSG, or other suitable dielectric material. Word lines 110 are parallel to ground lines 114. Word lines 110 and ground lines 114 are perpendicular to STI 214 and ILD 215.

Figure 25:
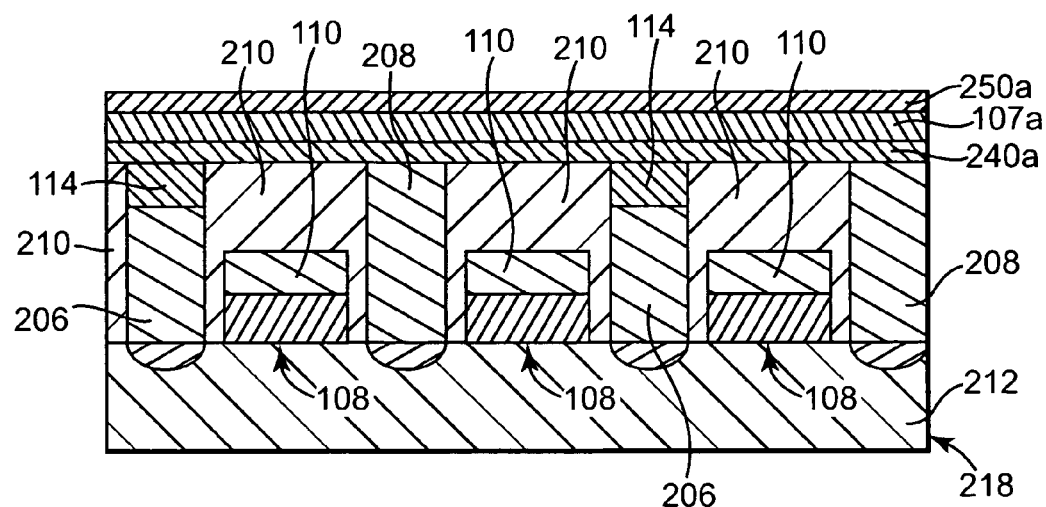
FIG. 25 illustrates a cross-sectional view of one embodiment of the preprocessed wafer, a first electrode material layer, a phase change material layer, and a second electrode material layer.

FIG. 25 illustrates a cross-sectional view of one embodiment of preprocessed wafer 218, a first electrode material layer 240a, a phase change material layer 107a, and a second electrode material layer 250a. Electrode material, such as TiN, TaN, W, Al, Cu, TiSiN, TaSiN, or other suitable electrode material, is deposited over preprocessed wafer 218 to provide first electrode material layer 240a. First electrode material layer 240a is deposited using CVD, ALD, MOCVD, PVD, JVP, or other suitable deposition technique.

Phase change material, such as a chalcogenide compound material or other suitable phase change material, is deposited over first electrode material layer 240a to provide phase change material layer 107a. Phase change material layer 107a is deposited using CVD, ALD, MOCVD, PVD, JVP, or other suitable deposition technique.

Electrode material, such as TiN, TaN, W, Al, Cu, TiSiN, TaSiN, or other suitable electrode material, is deposited over phase change material 107a to provide second electrode material layer 250a. Second electrode material layer 250a is deposited using CVD, ALD, MOCVD, PVD, JVP, or other suitable deposition technique. In one embodiment, an optional hardmask material layer is deposited over second electrode material layer 250a.

Figure 26:
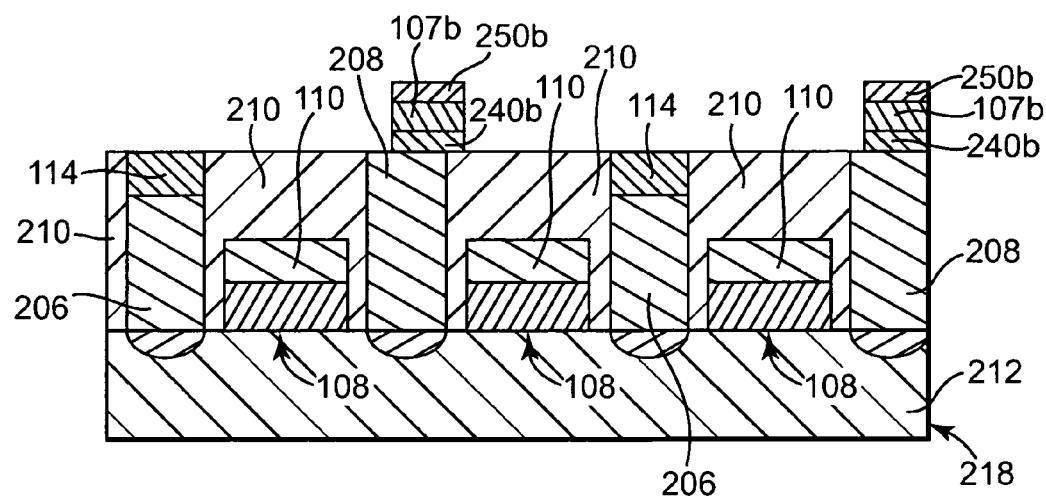
FIG. 26 illustrates a cross-sectional view of one embodiment of the preprocessed wafer, first electrode material layer, phase change material layer, and second electrode material layer after etching.

FIG. 26 illustrates a cross-sectional view of one embodiment of preprocessed wafer 218, first electrode material layer 240b, phase change material layer 107b, and second electrode material layer 250b after etching second electrode material layer 250a, phase change material layer 107a, and first electrode material layer 240a. Second electrode material layer 250a, phase change material layer 107a, and first electrode material layer 240a are etched to provide second electrode material layer 250b, phase change material layer 107b, which is self-aligned to second electrode material layer 250b, and first electrode material layer 240b, which is self-aligned to phase change material layer 107b. Line lithography is used to pattern lines of second electrode material 250b, phase change material 107b, and first electrode material 240b contacting second contacts 208. The line lithography does not need to be precisely centered over second contacts 208 as long as a portion of first electrode material 240b contacts second contacts 208. In this way, the line lithography is less critical yet the desired memory cell size is obtained.

In the embodiment where a hardmask material layer is deposited over second electrode material layer 250a, the hardmask material layer, second electrode material layer 250a, phase change material layer 107a, and first electrode material layer 240a are etched to provide an etched hardmask material layer, second electrode material layer 250b, which is self-aligned to the etched hardmask material layer, first phase change material layer 107b, which is self-aligned to second electrode material layer 250b, and first electrode material layer 240b, which is self-aligned to first phase change material layer 107b.

Figure 27A:
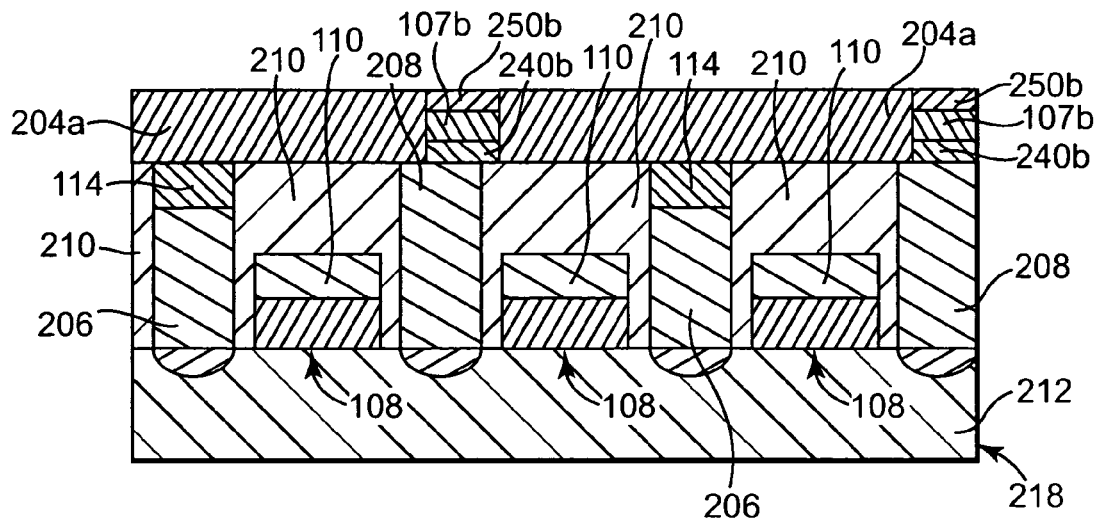
FIG. 27A illustrates a cross-sectional view of one embodiment of the preprocessed wafer, first electrode material layer, phase change material layer, second electrode material layer, and a dielectric material layer.
Figure 27B:
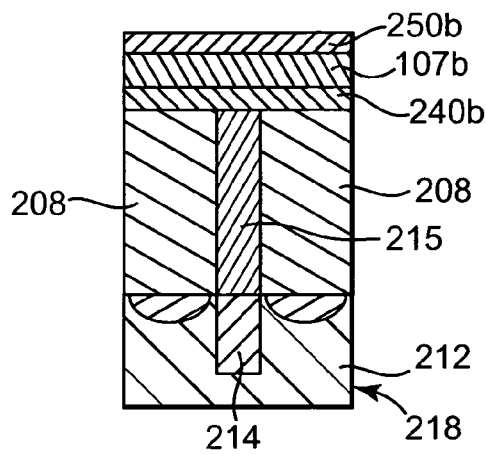
FIG. 27B illustrates a perpendicular cross-sectional view of the wafer illustrated in FIG. 27A.
Figure 27C:
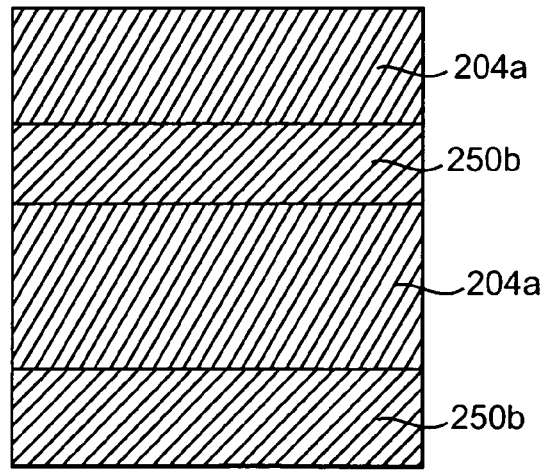
FIG. 27C illustrates a top view of the wafer illustrated in FIG. 27A.

FIG. 27A illustrates a cross-sectional view of one embodiment of preprocessed wafer 218, first electrode material layer 240b, phase change material layer 107b, second electrode material layer 250b, and a dielectric material layer 204a. FIG. 27B illustrates a perpendicular cross-sectional view of the wafer illustrated in FIG. 27A, and FIG. 27C illustrates a top view of the wafer illustrated in FIG. 27A. Dielectric material, such as $SiO_2$, FSG, BPSG, BSG, or other suitable dielectric material, is deposited over exposed portions of second electrode material layer 250b, phase change material layer 107b, first electrode material layer 240b, and preprocessed wafer 218. The dielectric material layer is deposited using CVD, ALD, MOCVD, PVD, JVP, HDP, or other suitable deposition technique. The dielectric material layer is planarized to expose second electrode material layer 250b and provide dielectric material layer 204a. The dielectric material layer is planarized using CMP or another suitable planarization technique. In the embodiment where an etched hardmask material layer is over second electrode material layer 250b, the dielectric material layer is planarized to expose the hardmask material. The hardmask material is then removed using a wet etch or other suitable technique.

Figure 28A:
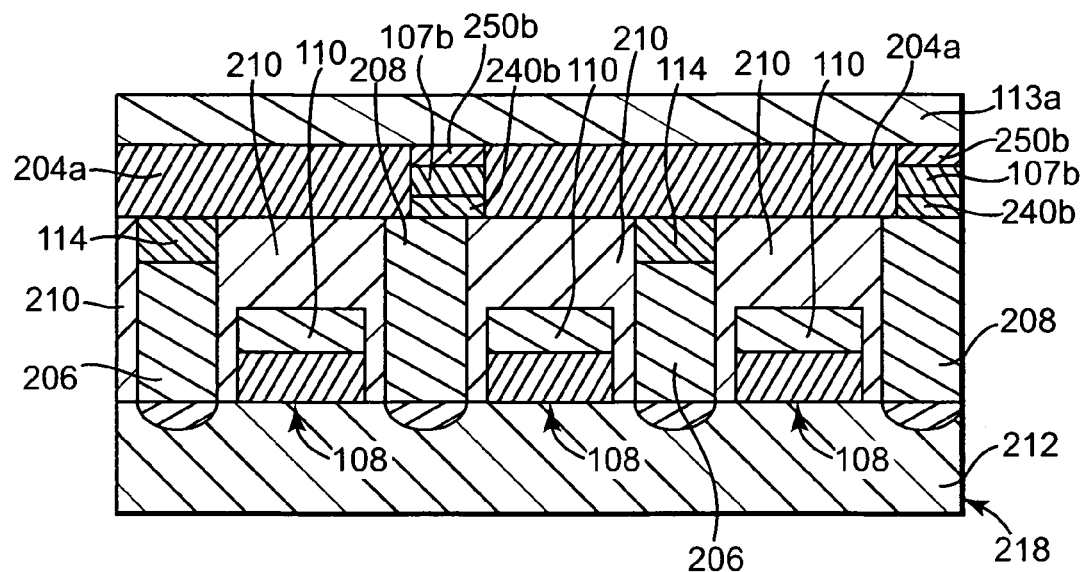
FIG. 28A illustrates a cross-sectional view of one embodiment of the preprocessed wafer, first electrode material layer, phase change material layer, second electrode material layer, dielectric material layer, and a third electrode material layer.
Figure 28B:
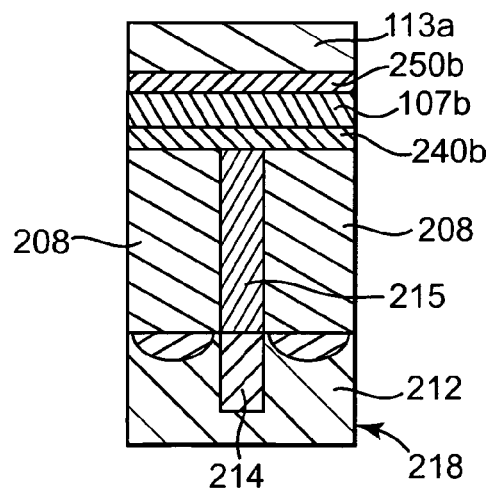
FIG. 28B illustrates a perpendicular cross-sectional view of the wafer illustrated in FIG. 28A.

FIG. 28A illustrates a cross-sectional view of one embodiment of preprocessed wafer 218, first electrode material layer 240b, phase change material layer 107b, second electrode material layer 250b, dielectric material layer 204a, and a third electrode material layer 113a. FIG. 28B illustrates a perpendicular cross-sectional view of the wafer illustrated in FIG. 28A. Electrode material, such as TiN, TaN, W, Al, Cu, TiSiN, TaSiN, or other suitable electrode material, is deposited over second electrode material layer 250b and dielectric material layer 204a to provide third electrode material layer 113a. Third electrode material layer 113a is deposited using CVD, ALD, MOCVD, PVD, JVP, or other suitable deposition technique.

Figure 29A:
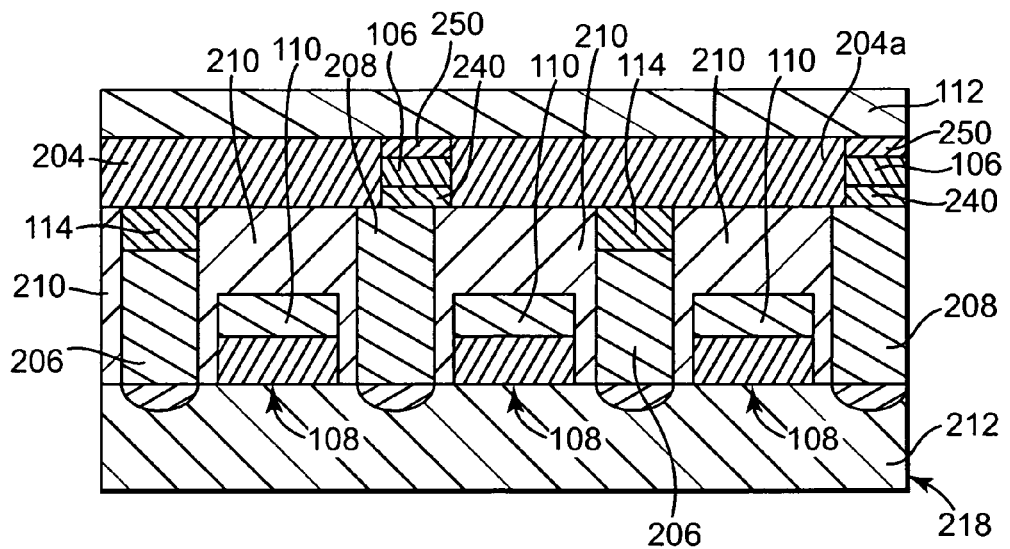
FIG. 29A illustrates a cross-sectional view of one embodiment of the preprocessed wafer, bottom electrodes, phase change material elements, top electrodes, dielectric material layer, and bit lines after etching.
Figure 29B:
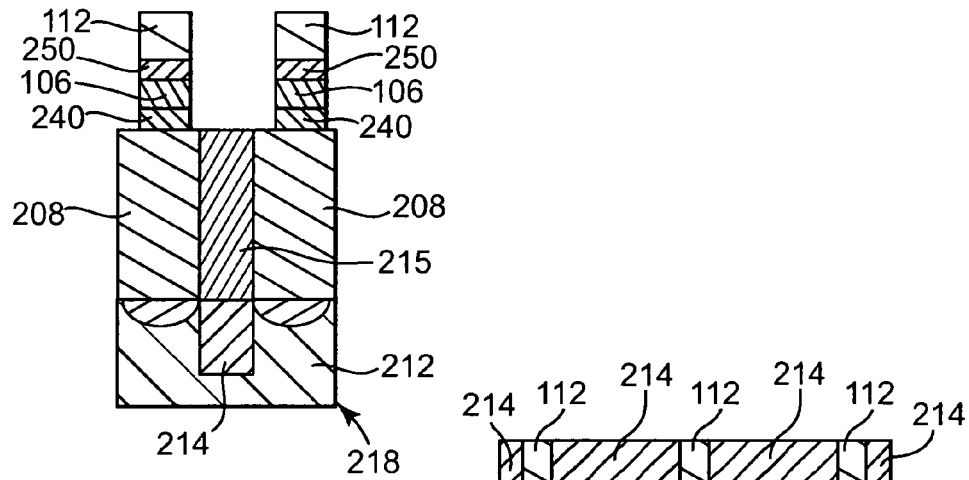
FIG. 29B illustrates a perpendicular cross-sectional view of the wafer illustrated in FIG. 29A.
Figure 29C:
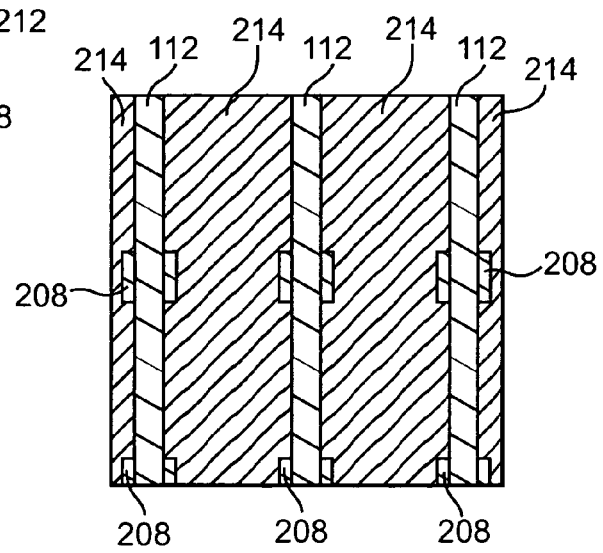
FIG. 29C illustrates a top view of the wafer illustrated in FIG. 29A.

FIG. 29A illustrates a cross-sectional view of one embodiment of preprocessed wafer 218, bottom electrodes 240, phase change elements 106, top electrodes 250, dielectric material layer 204, and bit lines 112 after etching third electrode material layer 113a, second electrode material layer 250a, phase change material layer 107b, dielectric material layer 204a, and first electrode material layer 240b. FIG. 29B illustrates a perpendicular cross-sectional view of the wafer illustrated in FIG. 29A, and FIG. 29C illustrates a top view of the wafer illustrated in FIG. 29A. Third electrode material layer 113a, second electrode material layer 250b, phase change material layer 107b, dielectric material layer 204a, and first electrode material layer 240b are etched to provide bit lines 112, top electrodes 250, which are self-aligned to bit lines 112, phase change elements 106, which are self-aligned to bit lines 112, bottom electrodes 240, which are self-aligned to bit lines 112, and dielectric material layer 204. Line lithography is used to pattern bit lines 112 perpendicular to lines of first electrode material 240b such that each bottom electrode 240 contacts a second contact 208. The line lithography does not need to be precisely centered over second contacts 208 as long as a portion of each bottom electrode 240 contacts a second contact 208. In this way, the line lithography is less critical yet the desired memory cell size is obtained.

Dielectric material, such as $SiO_2$, FSG, BPSG, BSG, or other suitable dielectric material, is deposited over exposed portions of bit lines 112, top electrodes 250, phase change elements 106, dielectric material layer 204, bottom electrodes 240, and preprocessed wafer 218. The dielectric material layer is deposited using CVD, ALD, MOCVD, PVD, JVP, HDP, or other suitable deposition technique. The dielectric material layer is planarized to expose bit lines 112 and provide dielectric material layer 216. The dielectric material layer is planarized using CMP or another suitable planarization technique to provide array of phase change memory cells 200c illustrated in FIGS. 23A-23C.

Embodiments of the present invention provide an array of phase change memory cells fabricated using line lithography and self-aligned processing to minimize critical lithography steps. In addition, interface resistances between metal and active material in the array is overlay-insensitive and by maximizing the interface areas, parasitic resistances are minimized. The array of phase change memory cells has an improved chemical mechanical planarization (CMP) process window and improved mechanical stability during fabrication.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory comprising:
   transistors in rows and columns providing an array;
   bit lines in columns across the array;
   phase change elements directly contacting the bit lines and self-aligned to the bit lines; and
   bottom electrodes directly contacting the phase change elements, each bottom electrode self-aligned to a bit line and coupled to one side of a source-drain path of a transistor.

2. The memory of claim 1, wherein each bottom electrode is self-aligned to a phase change element on a side perpendicular to the bit lines.

3. The memory of claim 1, further comprising:
   ground lines in rows across the array, each ground line coupled to the other side of the source-drain path of the transistors in each row.

4. The memory of claim 1, further comprising:
   word lines in rows across the array, each word line coupled to gates of the transistors in each row.

5. The memory of claim 1, wherein the memory is scalable to $6F^2$, where F is the minimum feature size.

6. The memory of claim 1, wherein the memory is scalable to $8F^2$, where F is the minimum feature size.

7. A memory comprising:
   transistors in rows and columns providing an array;
   bit lines in columns across the array;
   phase change material in columns across the array and providing storage locations, the phase change material directly contacting the bit lines and self-aligned to the bit lines; and
   bottom electrodes directly contacting the storage locations, each bottom electrode self-aligned to a bit line and coupled to one side of a source-drain path of a transistor.

8. The memory of claim 7, wherein each bottom electrode is self-aligned to a storage location on a side perpendicular to the bit lines.

9. The memory of claim 7, further comprising:
   ground lines in rows across the array, each ground line coupled to the other side of the source-drain path of the transistors in each row.

10. The memory of claim 7, further comprising:
    word lines in rows across the array, each word line coupled to gates of the transistors in each row.

11. The memory of claim 7, wherein the memory is scalable to $6F^2$, where F is the minimum feature size.

12. The memory of claim 7, wherein the memory is scalable to $8F^2$, where F is the minimum feature size.

13. A memory comprising:
    transistors in rows and columns providing an array;
    bit lines in columns across the array;
    top electrodes contacting the bit lines and self-aligned to the bit lines;
    phase change elements directly contacting the top electrodes and self-aligned to the bit lines; and
    bottom electrodes directly contacting the phase change elements, each bottom electrode self-aligned to a bit line and coupled to one side of a source-drain path of a transistor.

14. The memory of claim 13, wherein each bottom electrode is self-aligned to a phase change element on a side perpendicular to the bit lines.

15. The memory of claim 13, wherein each top electrode is self-aligned to a phase change element on a side perpendicular to the bit lines.

16. The memory of claim 13, further comprising:
    ground lines in rows across the array, each ground line coupled to the other side of the source-drain path of the transistors in each row.

17. The memory of claim 13, further comprising:
    word lines in rows across the array, each word line coupled to gates of the transistors in each row.

18. The memory of claim 13, wherein the memory is scalable to $6F^2$, where F is the minimum feature size.

19. The memory of claim 13, wherein the memory is scalable to $8F^2$, where F is the minimum feature size.

* * * * *